United States Patent
Pani et al.

(10) Patent No.: US 6,504,399 B2
(45) Date of Patent: Jan. 7, 2003

(54) METHOD AND APPARATUS FOR UNIVERSAL PROGRAM CONTROLLED BUS ARCHITECTURE

(75) Inventors: Peter M. Pani, Mountain View, CA (US); Benjamin S. Ting, Saratoga, CA (US)

(73) Assignee: Advantage Logic, Inc., Cupertino, CA (US)

( * ) Notice: Subject to any disclaimer, the term of this patent is extended or adjusted under 35 U.S.C. 154(b) by 4 days.

(21) Appl. No.: 09/960,916

(22) Filed: Sep. 24, 2001

(65) Prior Publication Data

US 2002/0011871 A1 Jan. 31, 2002

Related U.S. Application Data

(63) Continuation of application No. 09/243,998, filed on Feb. 4, 1999, now Pat. No. 6,329,839, which is a continuation of application No. 08/708,403, filed on Sep. 4, 1996, now Pat. No. 6,034,547.

(51) Int. Cl.[7] ............................................. H03K 19/177
(52) U.S. Cl. ............................. 326/41; 326/38; 326/39; 326/40
(58) Field of Search ...................... 326/38–41

(56) References Cited

U.S. PATENT DOCUMENTS

| | | | |
|---|---|---|---|
| 4,020,469 A | | 4/1977 | Manning |
| 4,661,901 A | | 4/1987 | Veneski |
| 4,684,830 A | * | 8/1987 | Tsui et al. ..................... 326/40 |

(List continued on next page.)

FOREIGN PATENT DOCUMENTS

| | | |
|---|---|---|
| EP | 0415542 A1 | 3/1991 |
| EP | 0630115 A2 | 12/1994 |
| GB | 2180382 A | 3/1987 |
| GB | 2295738 A | 6/1996 |
| WO | WO92/08286 A1 | 5/1992 |
| WO | WO94/10754 A1 | 5/1994 |
| WO | WO94/28475 A1 | 12/1994 |
| WO | WO95/04404 A1 | 2/1995 |
| WO | WO96/05964 A1 | 2/1996 |
| WO | WO96/35261 A1 | 11/1996 |

OTHER PUBLICATIONS

Richard Cliff et al., "A Dual Granularity and Globally Interconnected Architecture for a Programmable Logic Device",Proceedings of the IEEE 1993 Custom Integrated Circuits Conference, May 1993, pp. 7.3.1–7.3.5.

(List continued on next page.)

*Primary Examiner*—Michael Tokar
*Assistant Examiner*—Vibol Tan
(74) *Attorney, Agent, or Firm*—Blakely, Sokoloff, Taylor & Zafman

(57) ABSTRACT

The system and method of the present invention provides an innovative bus system of lines which can be programmed and to provide data, control and address information to the logic circuits interconnected by the bus system. This flexible structure and process enables a configurable system to be created to programmably connect one or more logic circuits, such as megacells. The programmability of the bus system enables the cascading of multiple megacells in an arbitrary fashion (i.e., wide, deep or both) and the sharing of common lines for system level communication.

142 Claims, 14 Drawing Sheets

U.S. PATENT DOCUMENTS

| | | | |
|---|---|---|---|
| 4,700,187 A | | 10/1987 | Furtek |
| 4,720,780 A | | 1/1988 | Dolecek |
| 4,736,333 A | | 4/1988 | Mead et al. |
| 4,847,612 A | | 7/1989 | Kaplinsky |
| 4,870,302 A | | 9/1989 | Freeman |
| 4,918,440 A | | 4/1990 | Furtek |
| 4,935,734 A | | 6/1990 | Austin |
| 4,992,680 A | | 2/1991 | Benedetti et al. |
| 5,144,166 A | | 9/1992 | Camarota et al. |
| 5,204,556 A | | 4/1993 | Shankar |
| 5,208,491 A | | 5/1993 | Ebeling et al. |
| 5,221,865 A | | 6/1993 | Phillips et al. |
| 5,243,238 A | | 9/1993 | Kean |
| 5,256,918 A | * | 10/1993 | Suzuki ............... 307/465 |
| 5,260,610 A | | 11/1993 | Pedersen et al. |
| 5,260,611 A | * | 11/1993 | Cliff et al. ............. 307/465 |
| 5,296,759 A | | 3/1994 | Sutherland et al. |
| 5,298,805 A | | 3/1994 | Garverick et al. |
| 5,329,470 A | | 7/1994 | Sample et al. |
| 5,349,691 A | | 9/1994 | Harrison et al. |
| 5,369,314 A | | 11/1994 | Patel et al. |
| 5,376,844 A | * | 12/1994 | Pedersen et al. ......... 326/41 |
| 5,396,126 A | | 3/1995 | Britton et al. |
| 5,406,525 A | | 4/1995 | Nicholes |
| 5,444,394 A | | 8/1995 | Watson et al. |
| 5,455,525 A | | 10/1995 | Ho et al. |
| 5,457,410 A | | 10/1995 | Ting |
| 5,469,003 A | | 11/1995 | Kean |
| 5,477,067 A | | 12/1995 | Isomura et al. |
| 5,519,629 A | | 5/1996 | Snider |
| 5,550,782 A | | 8/1996 | Cliff et al. |
| 5,552,722 A | | 9/1996 | Kean |
| 5,572,148 A | | 11/1996 | Lytle et al. |
| 5,581,199 A | | 12/1996 | Pierce et al. |
| 5,581,767 A | | 12/1996 | Katsuki et al. |
| 5,815,004 A | | 9/1998 | Trimberger et al. |
| 5,825,202 A | | 10/1998 | Tavana et al. |
| 5,835,405 A | | 11/1998 | Tsui et al. |
| 5,894,228 A | | 4/1999 | Reddy et al. |
| 5,903,165 A | | 5/1999 | Jones et al. |
| 6,034,547 A | | 3/2000 | Pani et al. |

OTHER PUBLICATIONS

Altera Corporation, Data Sheet, "Flex EPF81188 12,000–Gate Programmable Logic Device", Sep. 1992, Version 1.

Minnick, R.C., "A Survey of Microcellular Research", Journal of the Association for Computing Machinery, vol. 14, No. 2, Apr. 1967, pp. 203–241.

Shoup, R.G., "Programmable Cellular Logic Arrays", Ph.D dissertation, Carnegie–Mellon University, Pittsburgh, PA, Mar. 1970—Partial.

Spandorfer, L.M., "Synthesis of Logic Functions on an Array of Integrated Circuits", UNIVAC, Division of Sperry Rand Corporation, Blue Bell, PA, Contract AF 19 (628)2907, AFCRL 66–298, Project No. 464504, Nov. 30, 1965.

Ping–Tsung Wang et al., "A High Performance FPGA with Hierarchical Interconnection Structure", Institute of Electrical and Electronic Engineers, pp. 239–242, May 30, 1994.

Motorola Product Brief, "MPA10XX Field Programmable Gate Arrays", pp. 4 pages total, Sep. 27, 1993.

Krambeck, R.H. "ORCA: A High Performance, Easy to Use SRAM Based Architecture", Wescon '93 record, pp. 310–320, Sep. 20–30, 1993.

Buffoli et al., Dynamically Reconfigurable Devices used to Implement a Self–Tuning, High Performance PID Controller >>, IEEE 1989, pp. 107–112.

Devadas, S., "Boolean Decomposition of Programmable Logic Arrays", IEEE 1988, pp. 2.5.1–2.5.5.

Vidal, J., "Implementing Neural Nets with Programmable Logic", IEEE 1988, pp. 50–53.

Yachyang Sun et al., "An Area Minimizer for Floorplans with L–Shaped Regions", 1992, Int'l Conference on Computer Design, pp. 383–386.

ATMEL Corporation, "Field Programmable Gate Arrays—AT6000 Series", 1993.

Sinan Kaptanoglu et al., << A New High Density and Very Low Cost Reprogrammable FPGA Architecture, pp. 10 total pages.

Dave Bursky, "Fine–Grain FPGA Architecture Uses Four Levels of Configuration Hierarchy", Electronic Design, pp. 33–34, Oct. 1, 1993.

Dick L. Liu et al., "Design of Large Embedded CMOS PLA's for Built–In Self–Test", IEEE 1988, pp. 50–53.

Xilinx, "The Programmable Gate Array Data Book", 1992.

F. Zlotnick et al., A High Performance Fine–Grained Approach to SRAM based FPGA's Wescon '93 Record, pp. 321–326, Sep. 28–30, 1993.

Barry K. Britton et al., "Optimized Reconfigurable Cell Array Architecture for High Performance Field Programmable Gate Arrays", Proceedings of the IEEE 1993 Custom Integrated Circuits Conference, May 1993, pp. 7.2.1–7.2.5.

* cited by examiner

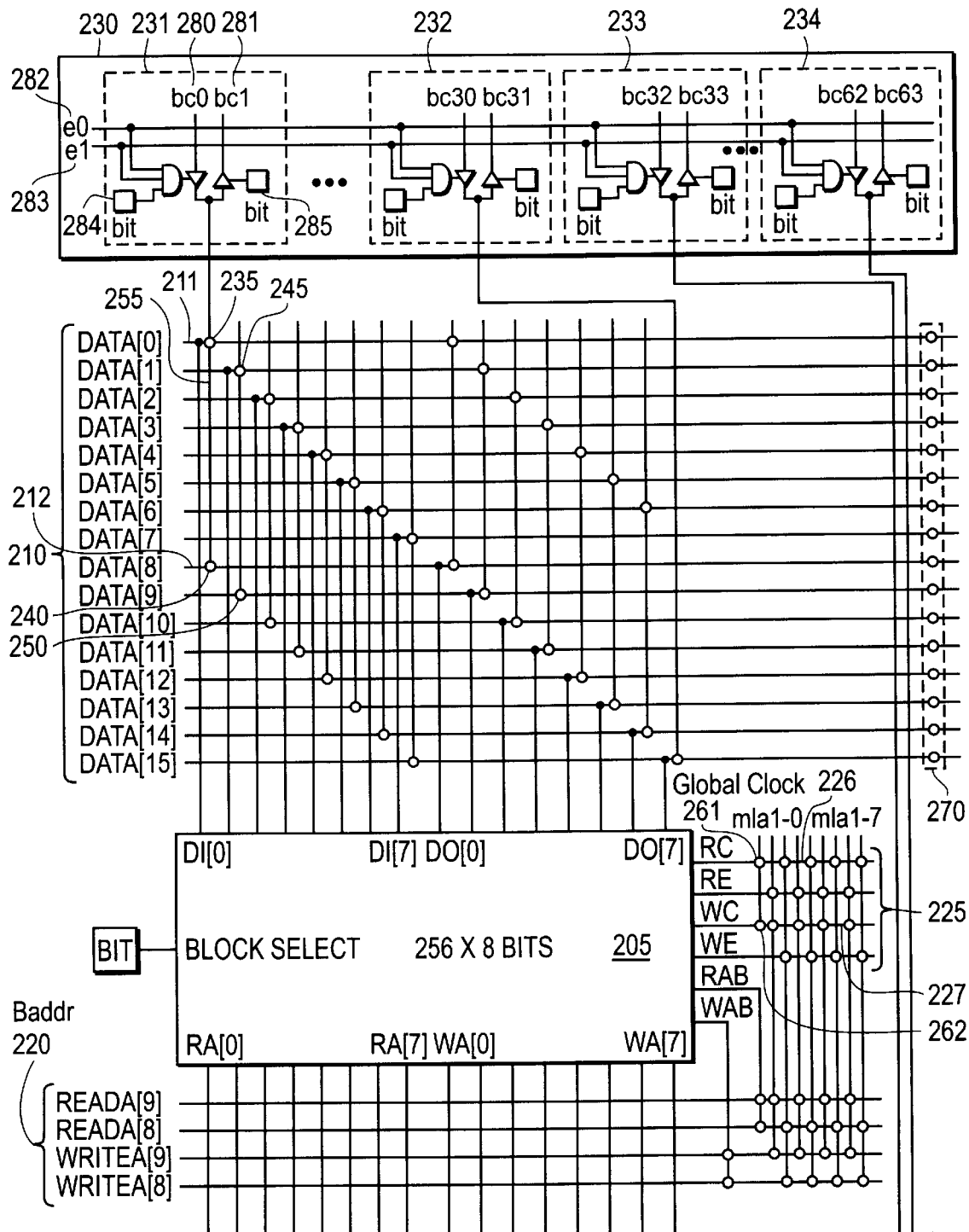
FIG. 2B ↓   FIG. 2A

— : Bus consisting of lines  ▢ : I/O

▯ : Logic Cluster next to I/O

METHOD AND APPARATUS FOR UNIVERSAL PROGRAM CONTROLLED BUS ARCHITECTURE

This application is a continuation application of Ser. No. 09/243,998; filed Feb. 4, 1999 now U.S. Pat. No. 6,329,839, which is a continuation application of Ser. No. 08/708,403 Filed Sep. 4, 1996 now U.S. Pat. No. 6,034,547; issued Mar. 7, 2000.

BACKGROUND OF THE INVENTION

1. Field of the Invention

The present invention is directed to a programmable, configurable bus system of lines to interconnect electrical components for an electrical/electronics system.

2. Art Background

Megacells are described as block components such as static random access memory (SRAM), microcontrollers, microprocessors and buffers. Sometimes it is desirable to interconnect a plurality of megacells together to provide a larger functional entity. One way to interconnect multiple megacells and logic circuits is through a hardwired bus system. Examples are illustrated in FIGS. 1a, 1b and 1c. illustrates a bus interface to a dual port SRAM megacell. Bus lines include DATA 0–DATA15, READA 0–READA9, WRITEA0–WRITEA9. To couple multiple megacells, the data lines are shared among the coupled cells. However, separate read and write lines would be required for each megacell. To the contrary, if the megacells were coupled to generate a deeper combined megaceu, the data lines would be separate for each megacell and the read and write lines would be shared among the megacells. Control signals are then be used to select a particular megacell for a particular operation. This is illustrated in FIGS. 1b and 1c.

Such configurations are hardwired and cannot easily be changed to accommodate different configurations. Furthermore, if errors occur in the mask generated, repairs are not easily made, as configurability is minimal. In addition to providing a bus system to interconnect multiple megacells, tristatable input ports are sometimes used to enable multiple inputs to be input to a particular bus line thus allowing a system level communication between logic to megacells or megacells to megacells. However, a single tristate can directly couple to only one Line.

SUMMARY OF THE INVENTION

The system and method of the present invention provides an innovative bus system of lines which can be programmed to provide data, control and address information to the logic circuits interconnected by the bus system in the context of an electrical/electronics system. This flexible structure and process enables a configurable system to be created to programmably connect one or more logic circuits such as megacells to external logic devices and other megacells. Thus, a system can be built using the bus structure of lines by selectively coupling the input signals and output signals from the logic circuits. The programmability of the bus system enables the cascading of multiple megacells in an arbitrary fashion (i.e., wide, deep or both) and the sharing of common lines for system level communication.

In one embodiment, a plurality of bussed lines are coupled to the data ports of megacells. A first set of programmable logic is coupled to selective lines of the system of lines and interface logic. The interface logic is coupled to input/output pads of the component for receipt of external input and output of data to be output external to the component. Individual elements of the first set of logic are programmed to selectively couple a particular interface logic element to a particular line and data port to enable the input and output of data to the megacell. It is preferred that, selective lines of the bus system of lines are each coupled to control ports of the megacell and a second set of programmable logic is coupled to the plurality of lines and interface logic elements to selectively couple a particular interface logic element to a particular line and control port to enable the selective input of control data. In another embodiment, the interface logic includes a plurality of programmable three state bi-directional input/out logic, each three state bi-directional input/output logic element coupled to the first set of programmable logic to provide further programmability to selectively couple one of the two external input or output to one of a plurality of the lines of the bus system.

In another embodiment, gateway logic is provided as coupled between the I/O pads and the processing logic. The interface logic can be configured to provide communication enhancements, such as protocols and the like, to enable sophisticated communications to and from the megacells through the bus system thus allowing a flexible scheme of a system on a chip having a bus system.

In other embodiments, programmable connections are provided between the I/O pads and the megacells and between the gateway logic and the megacells.

In addition, the programmable bus structure enables multiple megacells to be coupled together simply by programming the first set of programmable logic, second set of programmable logic and a third set of programmable logic which selectively extends the lines used to convey data, address and control information to additional megacells. This structure therefore enables additional megacells to be coupled without the prior art limitations of hardwiring connections and adding megacells in either the horizontal (width-wise) or vertical (depth-wise) orientation. Furthermore, the system allows the sharing of a common system bus for communicating among megacells.

BRIEF DESCRIPTION OF THE DRAWINGS

The objects, features and advantages of the present invention will be apparent to one skilled in the art from the following detailed description in which:

FIGS. 2A and 2B illustrate one embodiment in which logic is programnmably coupled to the megacell.

DETAILED DESCRIPTION

The system of the present invention provides a flexible programmable bus structure system of lines to couple one or more circuits for input and output as well as to each other. In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 1A:
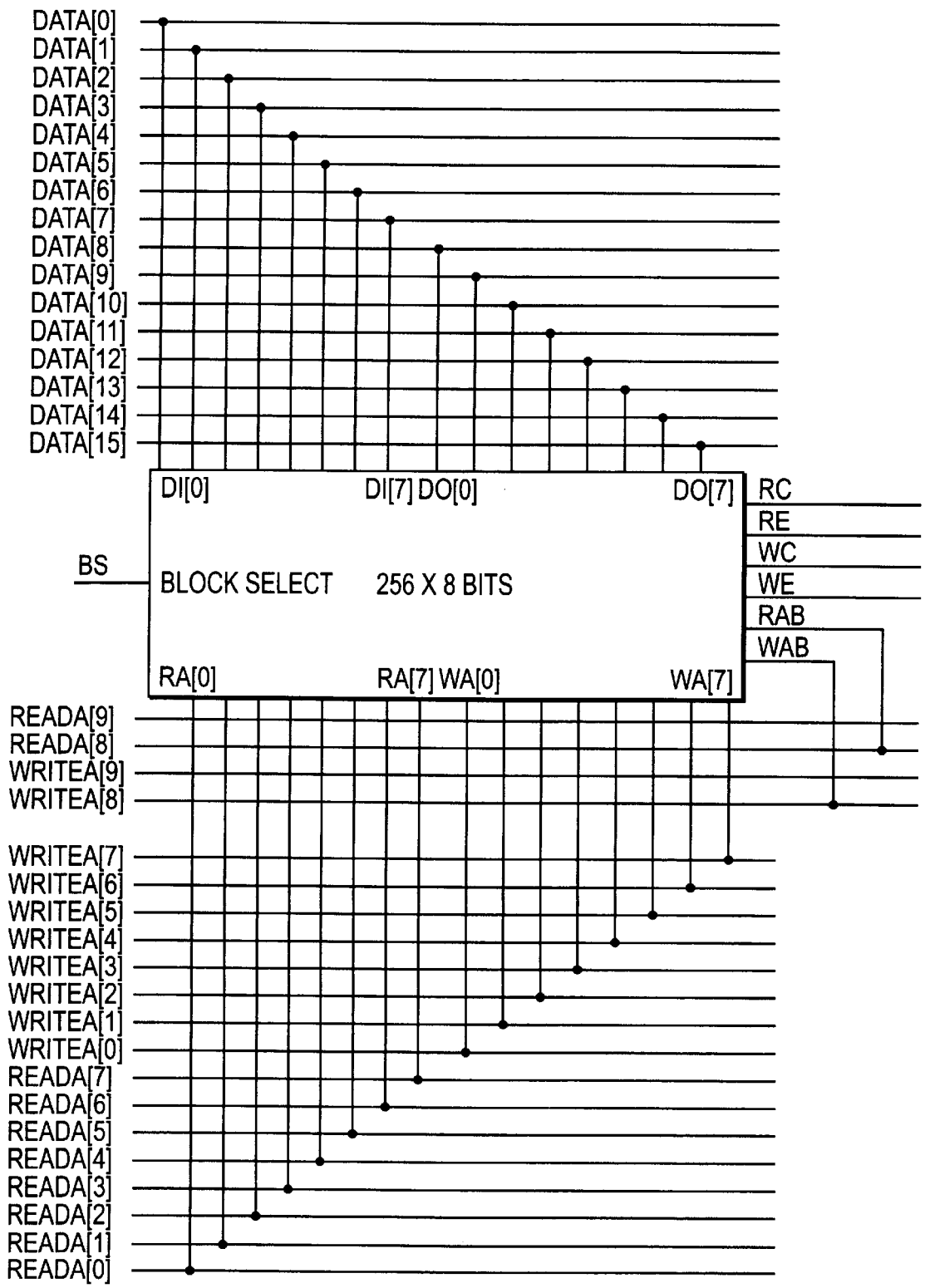
FIGS. 1a, 1b and 1c illustrate interconnections of prior art megacells.
Figure 1B:
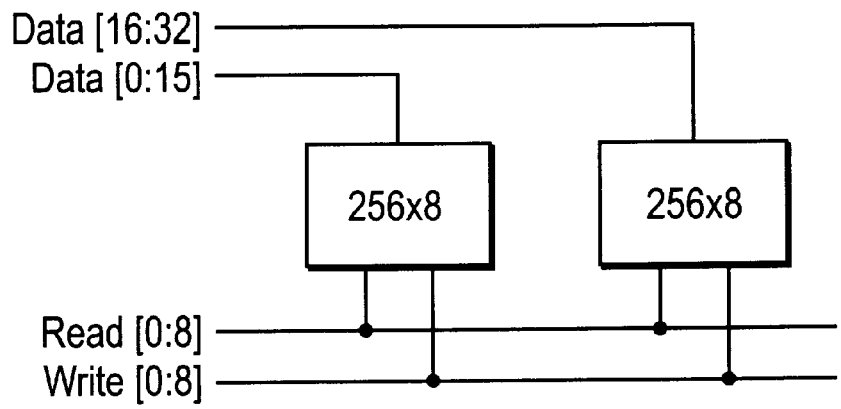
Figure 1C:
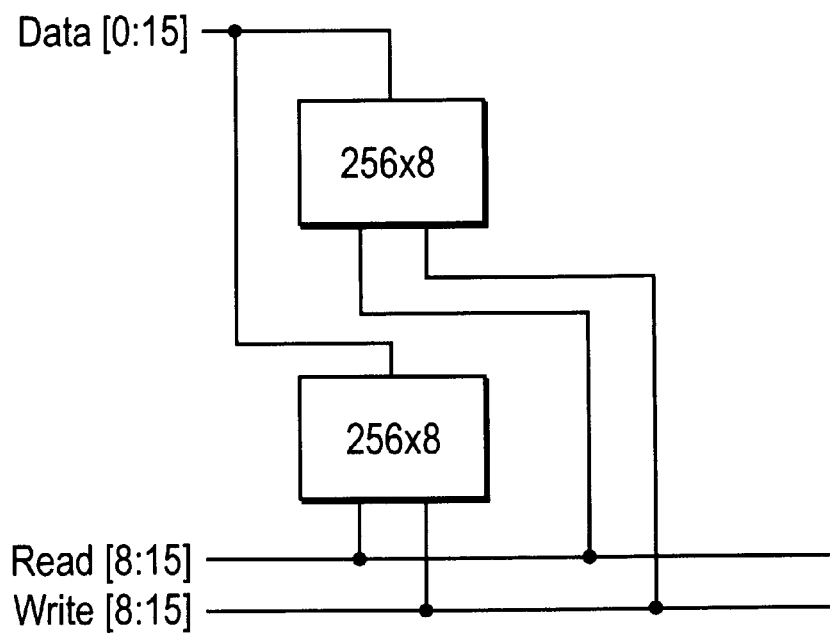
Figure 2B:
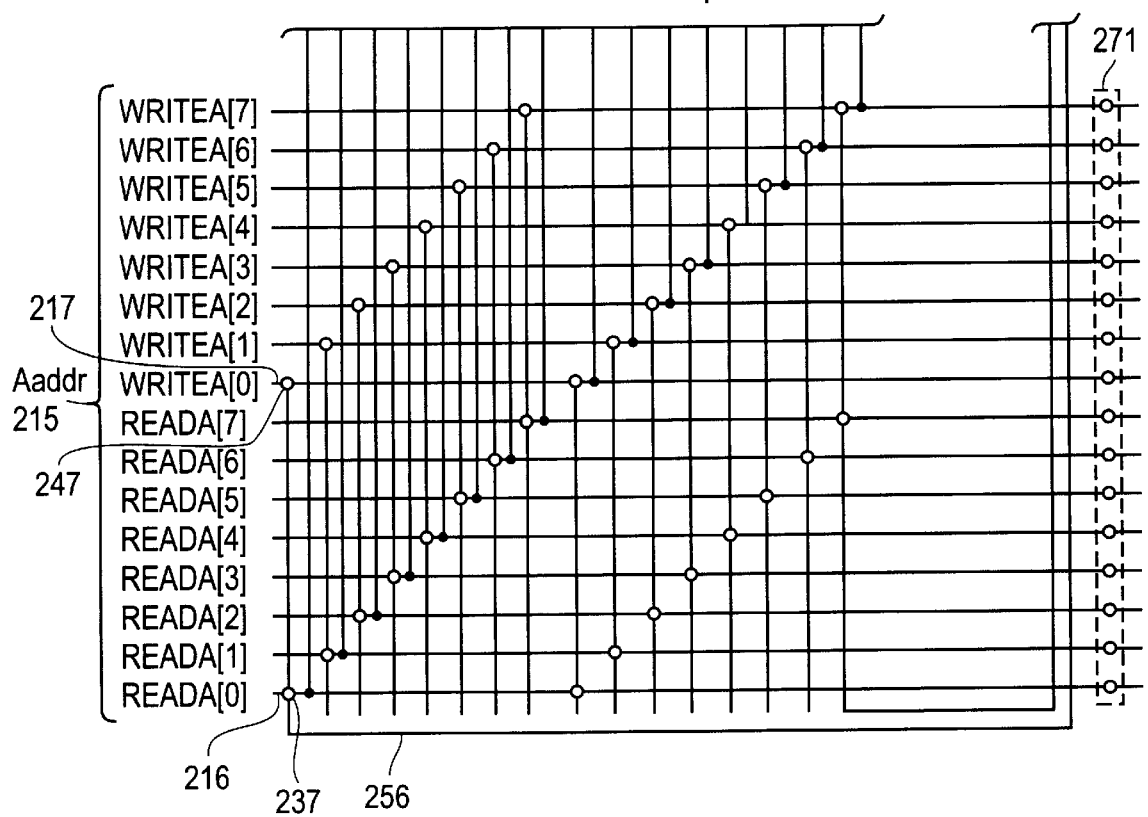

One embodiment of the programmable bus system is illustrated in FIGS. 2A and 2B. The system is illustrated using a megacell circuit; however, it is readily apparent that the system can be utilized with a variety of types of circuits and/or components. The type of megacell component used in the following discussion is a 256×8 dual port static random access memory (SRAM). However, the bus system described herein is not limited to SRAM components. A variety of components, such as microcontrollers, buffers, digital signal processors (DSPs) can be coupled to the bus system described herein.

FIGS. 2A and 2B illustrate one embodiment of the configurable bus system of the present invention. Referring to FIGS. 2A and 2B, the configurable bus system of lines includes groups of lines 210, lines 215, and lines 220, 225. Each data input/output port of the megacell 205 is connected to one line of lines 210. For example, DI[0] is connected to Data[0], DI[1] is connected to Data[1], etc. In addition, each read or write address port of the megacell 205 is connected to one of the group of lines 215. Furthermore, lines 225 are connected to the control ports of the megacell 205. It is recognized that the exemplary system described herein has been programmed to convey address, data and control information across certain of the lines which form the bus system of lines. It is readily apparent that in other applications the system may only convey other combinations of information such as data and control. In addition, one skilled in the art recognizes that the lines are programmable and can be configured for a variety of types of information in addition to the types of information described herein.

In the present embodiment, data is preferably input to the megacell 205 and output from the megacell through interface logic 230. As will be described below, the interface logic is embodied in a programmable logic device, such as a field programmable gate array (FPGA); however, other types of logic can be used. A first set of programmable connections programmably couple the interface logic 230 to the data input/output ports of the megacell 205 (e.g., elements 235, 240, 245, 250). For example, programmable elements 235, 240 selectively connect a first line 255 from the interface logic 230 to lines Data[0] 211 and Data[8] 212. In addition, in the present embodiment, the programmable elements of the first set of programmable elements programmably couple the interface logic 230 to line 215. For example, programmable elements 237, 247 selectively connect a first line 256 from the input/output logic 230 to bussed lines READA[0] 216 and WRITEA[0] 217. Furthermore, the location of the programmable elements and the lines that each programmable element selectively connect to can be varied according to application. FIGS. 2A and 2B illustrate one arrangement of programmable elements of the first set of programmable elements that provides flexibility in configuring the bus system of lines.

The control signals to the megacell 205 can be similarly transmitted over the configurable bus system described herein. A second set of programmable connections are used to selectively connect control signals received from the interface logic 230 to the lines 225 and megacell 205. For example, programmable elements 261, 262 selectively connect a global clock input to lines 226, 227. In addition, in the present embodiment, lines READA[8], READA[9], WRITE[8], WRITEA[9] (220 collectively) are used to provide the higher order address bits as control inputs to select other coupled megacells. This illustrates the capability of this innovative bus system to provide system level integration.

Preferably, a third set of programmable connections are used to selectively extend the number of megacells coupled to the configurable bus system. The bus system is configurable using elements of the third set of programmable connections to selectively connect on or more megacells to the bus system of lines. The third set of programmable connections selectively limit the load on the lines for better performance by extending the lines (and therefore increasing the load) only when needed. In the present embodiment, for example, programmable elements 270, 271 selectively extend the lines 210 and lines 215.

In addition, it is preferred that the interface logic 230 is programmable and provides bidirectional access to the bus. In addition, it is preferably that the interface logic provides three-statable control to the bus. In particular, control bits and associated logic is used to provide bidirectional, three state control and selective input/output of a plurality of external connections to the lines of the bus system. Referring to FIG. 2, the input/output logic 230 includes a plurality of elements, e.g., 231, 232, 233, 234. Each element is coupled to two external connections 280, 281. Each element is further coupled to enable control signals, e0 282, e1 283. The enable control signals e0, e1 and control bits 284, 285 function to provide the three state bus functionality that selects one of two external connections for input to or output from the bus. Control bit 284 controls the connection as input to the megacell 205 and control bit 285 controls the connection as output from the megacell 205. If the control bit 284 is set to a first state, e.g., zero, the three-state connection is disabled. If the control bit 284 is set to a second state, e.g., 1, the state of the connection is controlled by enable control signals e0, e1. Although the present embodiment incorporates the bidirectional, three state access to the bus system of lines, it is contemplated that bidirectional three state access mechanism is implemented separate from the interface logic.

The programming of the bus system of lines can be achieved a variety of ways. One method is to manually program the different programmable connections associated with particular lines of the bus system of lines. Other automated methods are also contemplated. Obviously, once programmed, the programmable connections can remain in the programmed state. Alternately, a dynamic programmable system can be provided wherein control circuitry coupled to the bus system and the programmable connections can determine, prior to a data transfer, those connections to program in order to configure the bus system of lines to transfer the data. This control circuitry could reside in a circuit coupled to the bus system for the transfer of data or in a circuit external to the bus system and connected circuits. For example, the bus system may couple a processor or arithmetic logic unit and memory. The processor or ALU can contain the control circuitry to configure the bus for each data transfer or plurality of transfers.

Furthermore, it is contemplated that the connections to be programmed can be determined a variety of ways in order to configure the bus system for a general transfer or specific transfers of data. For example, the control circuitry could examine the content of the data to be transferred and the control signals issued prior to or contemporaneous with a request to transfer or a signal indicating data is to be transferred (e.g., read or write signals or commands) to determine the programmable connections to be programmed.

The bus system described can be used to connect components, logic circuits and the like which span across one or more elements. In the present example, as noted above, the bus system is used to connect memory (SRAM) to the logic of a programmable logic device (PLD) such as a field programmable gate array (FPGA). More particularly, in the present embodiment, the bus system is used to integrate the memory into the same component as the FPGA. The FPGA, embodied as the interface logic in the present embodiment, preferably functions as control logic for accessing the SRAM or as interface logic between the SRAM and other devices. Preferably, a programmable logic device such as those described in U.S. Pat. No. 5,457,410 and U.S. patent application Ser. No. 08/534,500, filed Sep. 27, 1995 is used.

Figure 3:
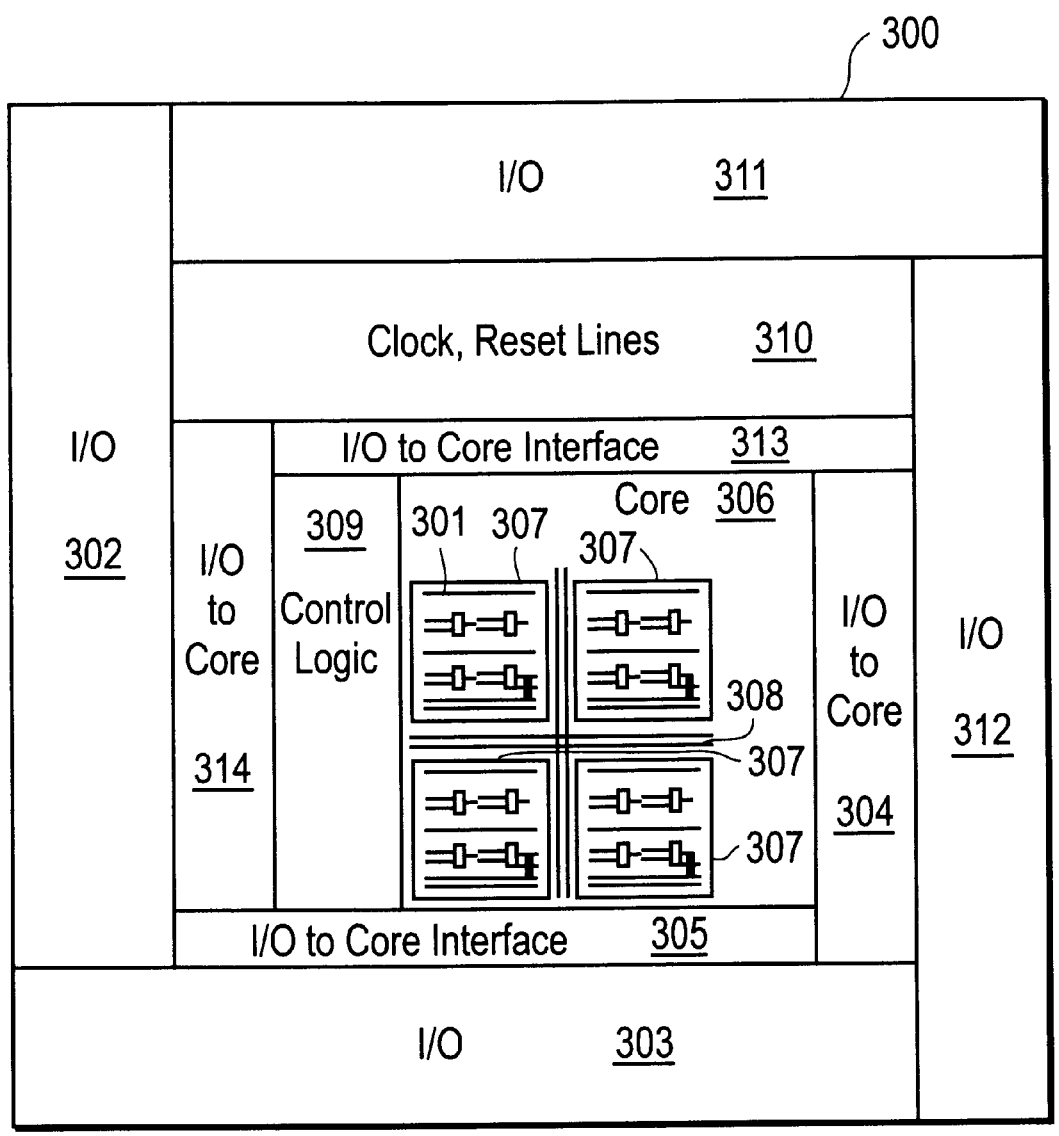
FIG. 3 is a block diagram illustration of exemplary programmable logic utilized to implement one embodiment of the configurable bus system of the present invention.

FIG. 3 is a block diagram of an exemplary FPGA 300. The I/O logic blocks 302, 303, 311, and 312 provide an interface between external package pins of the FPGA 300 and the internal user logic either directly or through the I/O to Core interface 304, 305, 313, 314. The external package pins are coupled to the lines of bus system (210, 215, FIG. 2), the signals that are processed through the input/output logic (230 FIG. 2), and the ports of the megacell (205, FIG. 2. Four interface blocks 304, 305, 313 and 314 provide decoupling between core 306 and logic 302, 303, 311 and 312.

The Core 306 includes configurable logic and an interconnect hierarchy. In the present embodiment, the logic is organized in a number of clusters 307 of logic which are intraconnected by an I-Matrix 301 and interconnected by MLA routing network 308. The core also includes control/programming logic 309 to control the bits for programming the intraconnection and interconnection lines. In the embodiment described herein, SRAM technology is utilized. However, fuse or antifuse, EEPROM/ferroelectric or similar technology may be used. In order to minimize skewing, a separate clock/reset logic 310 is used to provide clock and reset lines on a group basis.

Figure 4A:
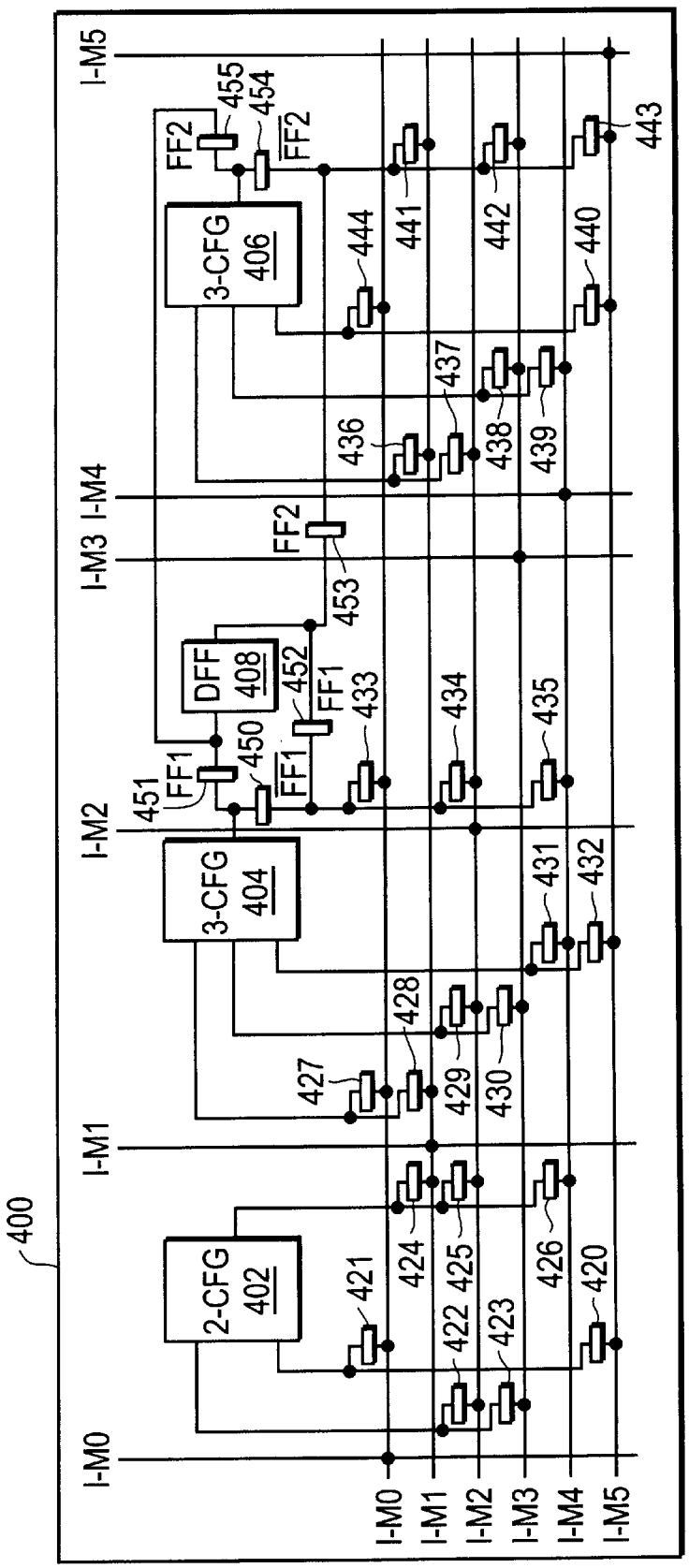
FIGS. 4A and 4B illustrate the organization of the programmable logic of FIG. 3.

The present embodiment provides logic in groups called clusters. FIG. 4a is an example of a logic cluster. It is contemplated that the logic cluster illustrated by FIG. 4a is illustrative and logic cluster can be formed of other elements such as logic gates and flip-flops. Referring to FIG. 4a, the logic cluster 400 is formed of four logic elements. These elements include one 2 input combinational logic or configurable function generator (CFG) 402, two three input CFGs 404, 406 and D flip-flop 408. CFG 402 can also be a three input CFG. The CFGs 402, 404, 406 are programmable combinatorial logic that provide a predetermined output based using two input values (for CFG 402) or three input values (for CFGs 404, 406). The CFGs are programmed with values to provide output representative of a desired logic function. The D flip flop 408 functions. as a temporary storage element such as a register.

This combination of one two input, one output CFG, two three input one output CFGs and a D flip flop enable a variety of logic and arithmetic functions to be performed. For example, the elements can be programmed to perform such functions as comparator functions or accumulator functions. In the present embodiment, it is used to selectively couple bus signal lines to input/outputs of a megacell and to input/output logic. It should be noted that this combination of elements provides a fine granularity without the addition of redundant elements which add to the die size and speed of processing. Furthermore, the combination of elements also maximizes usage of elements thereby maximizing usage of die size space. The fine granularity characteristic resulting in more output points that can be tapped is a desirable characteristic as often an intermediate signal generated by a particular combination of elements is needed.

In addition, the local interconnect within the cluster is structured to enable signals to be processed with minimum delays. The cluster elements, 402, 404, 406, 408, are connected through interconnection lines I-M0 through I-M5 (referred to herein collectively as I-Matrix lines) which are oriented horizontally and vertically through the logic cluster. These intraconnections of a cluster are programmable through switches, for example switches 420–444. Intraconnections lines I-M0 to I-M5 and switches 420–444 form what is referred to herein as the I-Matrix. The I-Matrix provides connectability among the elements 402, 404, 406, 408 to at least one other element of the cluster. For example, the output of the CFG 202 can be connected to the input of CFG 404 by enabling switches 424 and 428.

To ensure minimum signal delays during processing, separate, direct connections are provided between the D flip flop 408 and the three input CFGs 404, 406. Continuing reference to FIG. 4a, switches 450–455 and connected lines provide such connections. It has been determined that the input and output of the three input CFGs 404, 406 often perform programmed functions in conjunction with the register 408. For example the three input CFGs can be utilized with the register to provide a one bit multiplexing function.

The bidirectional switches 450–455 can be programmed a variety of ways to route the signal to achieve a specific function. For example, a signal output by CFG 404 can drive D flip-flop 408 by enabling switch 451. Alternately, the signal may be driven onto the I-Matrix by enabling switch 450. Similarly, the output of CFG 406 can drive the input of the D flip-flop 408 by enabling switch 455. Other routing paths by selectively enabling switches are also possible. Furthermore, the output of the CFG 402 can drive the D flip-flop 408 by an indirect connection through the I-Matrix. Thus, extreme flexibility is achieved.

The routing of the output signal of the D flip-flop is also programmable through switches 452 and 453. By selectively enabling switches 452 or 453 and selective switches of the I-Matrix, the output signal can be routed to any one of the elements of the cluster or of other clusters. The signal output is selectively routed through the switches 433–435 adjacent to the CFG 204 or to switches 441, 442 and 443 adjacent to CFG 406. Die savings are achieved without decreasing the level of usage of elements in the device.

Figure 4B:
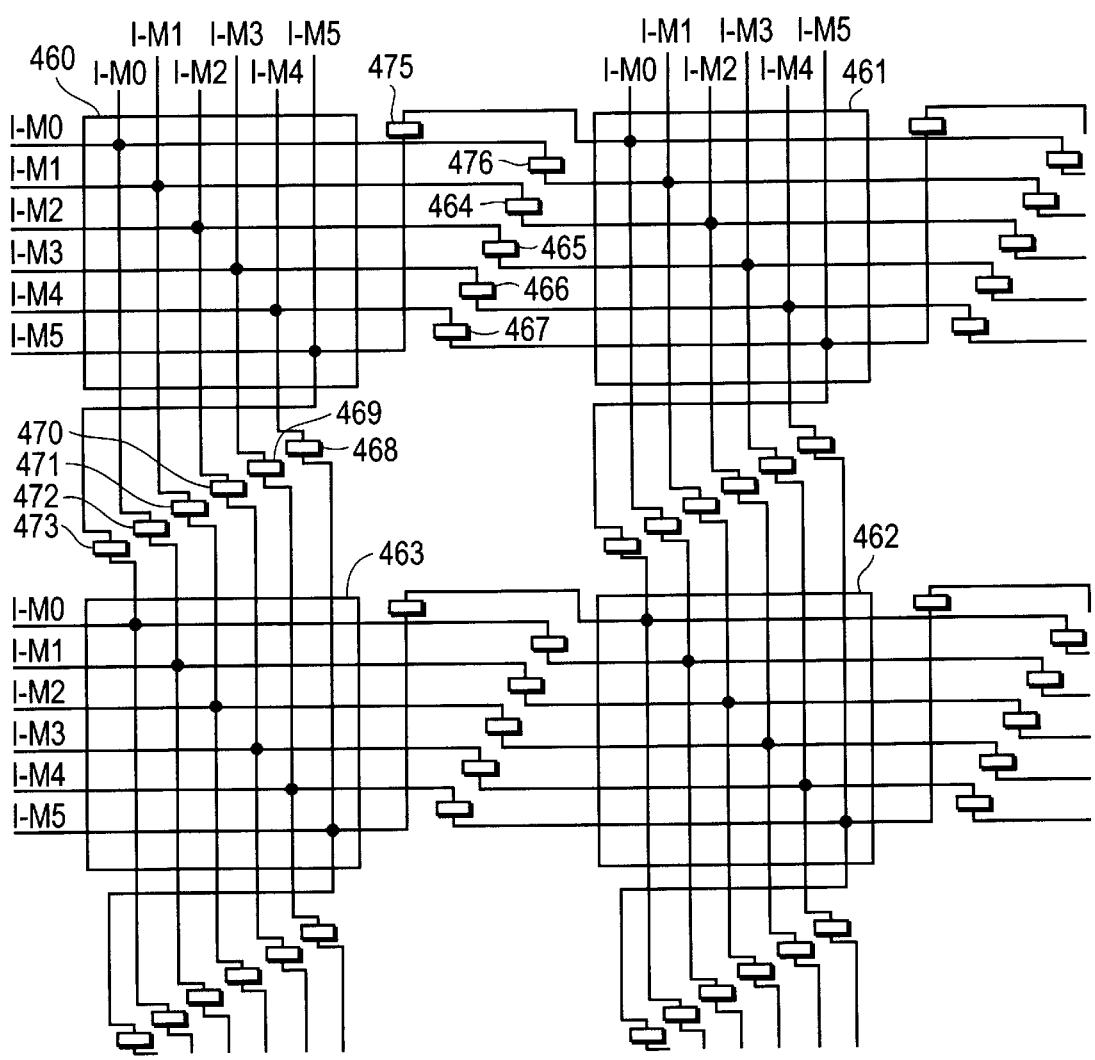

Each logic cluster is connectable to the other logic clusters inside the logic block through switches extending the I-matrix between neighboring clusters. FIG. 4b illustrates I-matrix interconnection lines I-M0 to I-M5 of a first logic cluster 460 selectively connected to the I-Matrix lines of adjacent logic clusters 461 and 463, respectively through switches 464, 465, 466, 467, 475 and 476.

The flexibility herein described is partially achieved through the numerous bi-directional switches used. It was also noted previously that the switches can be implemented a variety of ways. For example, the switches can be implemented as fusible links which are programmed by blowing the fuse to open or short the switch. Alternately, the switch can be a passgate controlled by a bit in an SRAM array. The state of the bits in the array dictate whether a corresponding passgates are open or closed.

To allow an efficient implementation of a carry chain as well as other applications, staggered or barrel connections between clusters is used to increased connectivity. FIG. 4b illustrates the extensions of the I-Matrix within a logic cluster to neighboring clusters. For example, switch 475 connects I-M5 of cluster 460 to I-M0 of cluster 461 and switch 476 connects I-M1 of cluster 460 to I-M2 of cluster 461.

Figure 5A:
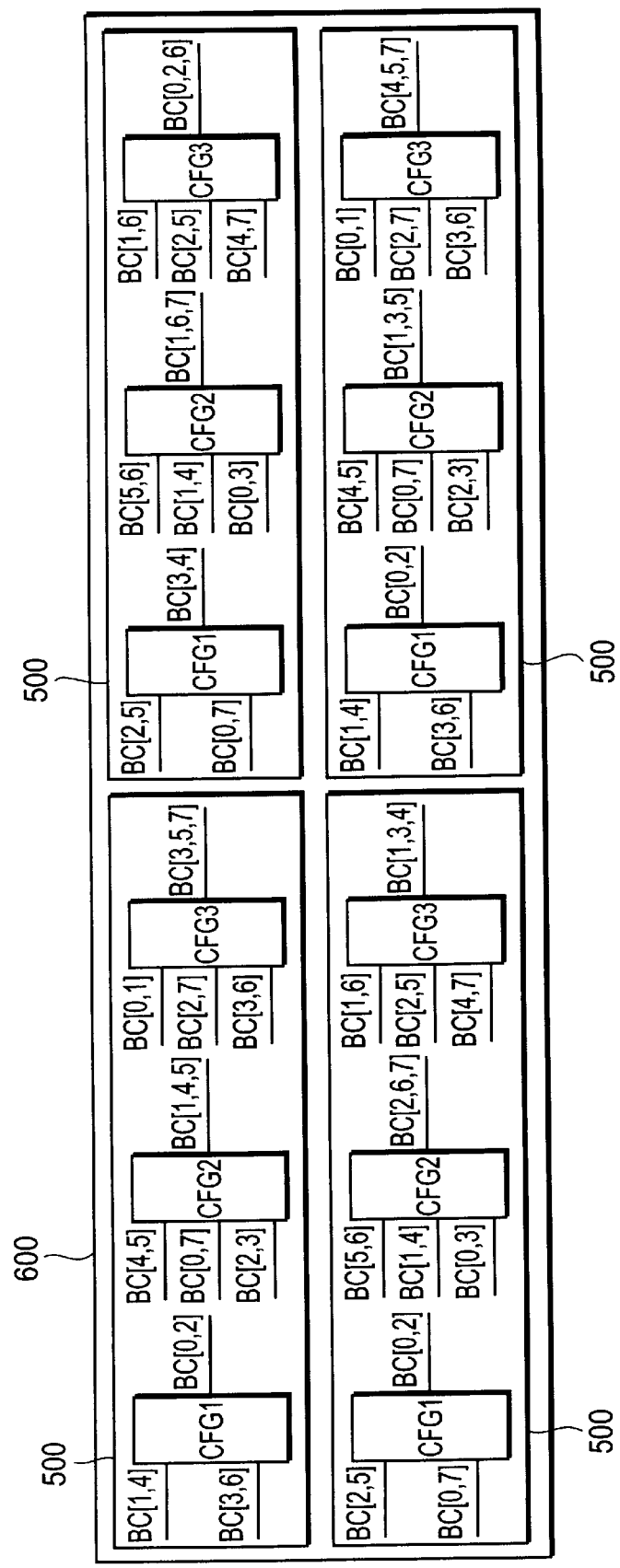
FIGS. 5A and 5B provide further illustration of the organization of the programmable logic of FIG. 3.

A plurality of interconnected logic clusters form a logic block. In the present embodiment each logic block consists of four logic clusters organized in a 2×2 array as generally illustrated by FIG. 5a. Each logic block has a set of bi-directional routing lines to which all CFGs inside the logic clusters are programmably connected. The bidirectional routing lines provide the path for signals to travel into and out of the logic block to the routing lines of a hierarchical routing architecture having multiple lengths of interconnections at different levels of the hierarchy. It can also be seen that the block connectors can also provide connections among the CFGs of the logic clusters of the same block and adjacent blocks. Although the input and output of each element of each logic cluster of the logic block can be selectively connected to each block connector, to control the expansion on die size it is preferred that each input and output is selectively connected to a subset of block connectors. An example of such an embodiment is shown in FIG. 5b.

Figure 5B:
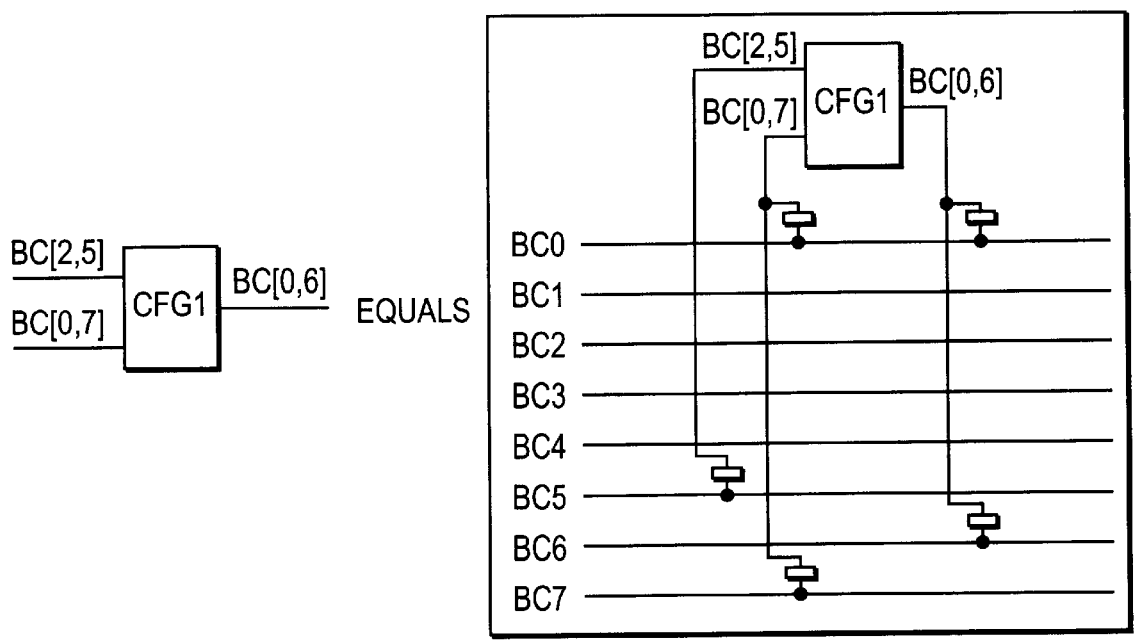

Referring to FIG. 5b, a symbolic representation of one embodiment of the connections to block connectors within a block 300 is shown. Each element of each cluster 500, e.g., CFG1, CFG2 and CFG3 is connected to two identified block connectors (BC) at the inputs. Two block connectors are identified as coupled to the output of the two input CFG1 and three block connectors are coupled to the output of the three input CFGs (CFG2, CFG3). The specific block connectors coupled to each elements are distributed among the elements of the block to maximize connectivity.

The block connectors provide the input and output mechanism for interconnecting to higher levels of connections of the routing hierarchy referred to as the multiple level architecture (MLA) routing network. The network consists of multiple levels of routing lines (e.g., MLA-1, MLA-2, MLA-3, MLA-4, etc.) organized in a hierarchy wherein the higher level routing lines are a multiple longer than the lower level routing lines. For example, MLA-2 routing lines are twice as long as MLA-1 routing lines and MLA-3 routing lines are twice as long as MLA-2 routing lines and MLA-4 routing lines are twice as long as MLA-3 routing lines.

Using the logic and interconnect hierarchy described, the user can program the PLD and the bus to access the memory in a variety of configurations without requiring significant space on the component.

Figure 6:
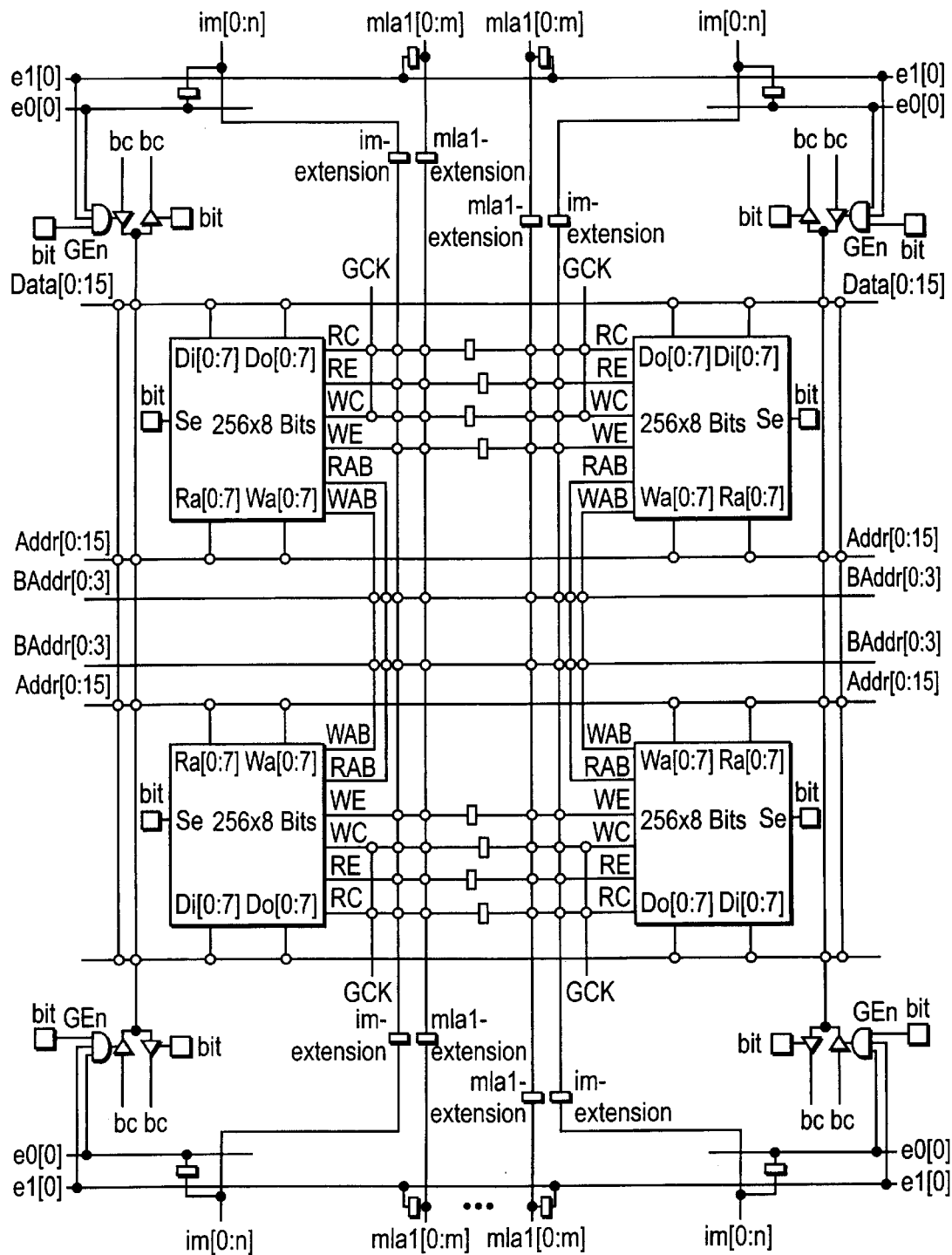
FIG. 6 illustrates the programmability of connections to bussed signal lines to multiple megacells in accordance with the teachings of the present invention.

The flexibility and utility of the configurable bus system of the present invention is illustrated with reference to FIG. 6. FIG. 6 shows the bus system configured to couple to 4 SRAM megacells arranged in a 2×2 configuration. The programmable elements are configured as passgates controlled by a bit in one of the SRAMs or other coupled memory. As is illustrated, no extra logic or interconnect is required for the bus system configuration. By enablement of the proper links which control the interconnect, the bus system is easily configured for the particular arrangement of megacells.

In the present example, the bus system is programmed to be coupled to the interconnect of the FLD (e.g., block connectors (bc), I-matrix lines (IM) and MLA lines (MLA-1)) to enable the logic of the PLD to provide the necessary interface logic to interface the SRAM to components or devices external to the system. For example, the PLD provides logic to assert the necessary control signals to transmit the address information and receive and transmit data. In the example shown in FIG. 6, data and address information is communicated through the bi-directional block connectors. Control information, including control signals to control the state of the enable signals (e0, e1) are communicated via the I-matrix and MLA-1 lines.

Figure 7A:
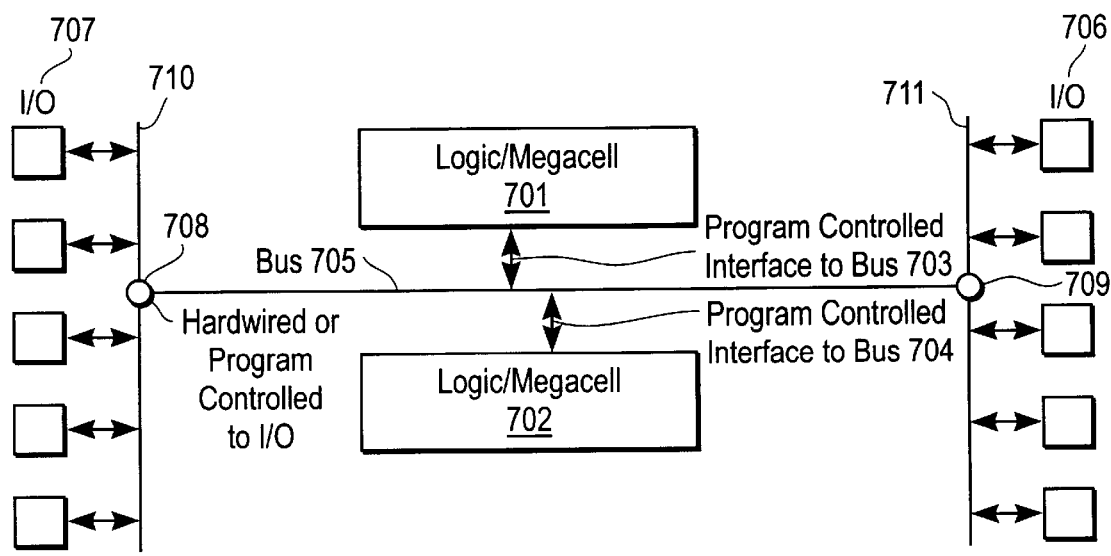
FIG. 7a is a block diagram illustration of one embodiment of a megacell connected to the bus system and I/O.

FIG. 7a is a block diagram illustration of one embodiment of megacell 701, 702, coupled to the bus system of the present invention. A program controlled interface 703, 704, to the bus system of lines 705 and megacells 701, 702 are provided. The interface from the core bus 705 to the I/O 706, 707 can be achieved using hardwired or program controlled connections 708, 709. Preferably, these connections are achieved using a programmable, peripheral bus system of lines 710, 711 to provide further flexibility. The peripheral bus system is preferably programmable in the same manner as described above with respect to FIG. 2. In the present embodiment, the interface logic (230 FIG. 2) provides the program controlled interface 703, 704 to the bus system 705 which is also programmed controlled.

Figure 7B:
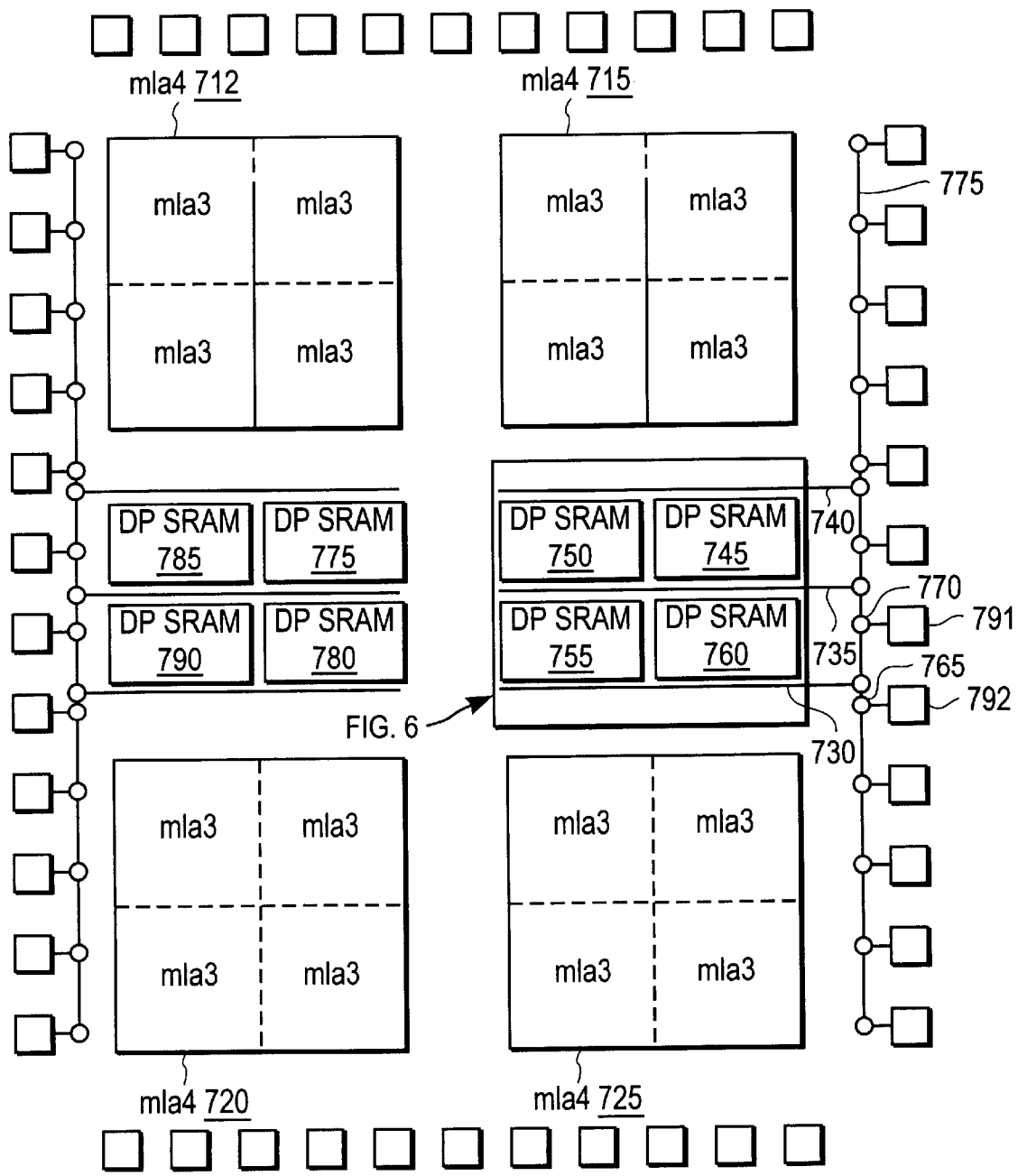
FIG. 7b illustrates one embodiment of a dual-port static random access memory (SRAM) megacell with a field programmable gate array (FPGA).

FIG. 7b depicts an overview of an exemplary component configured with dual port SRAM megacells and a FPGA. The FPGA, including its interconnect structure, is represented by elements 712, 715, 720, 725. Each element 712, 715, 720, 725 comprises a plurality of logical blocks organized in 16×16 array with a corresponding hierarchical interconnect structure as discussed in U.S. Pat. No. 5,457, 410 and U.S. patent application Ser. No. 08/534,500. The FPGA elements 712, 715, 720, 725 are connected by the interconnect, e.g., block connectors, I-matrix lines and MEA lines (see FIG. 6), through the configurable bus system of lines (e.g., as represented by elements 730, 735, 740) to an SRAM (e.g., 745, 750, 755, 760). SRAM 745, 750, 755, 760 and elements 730, 735 and 740 correspond to the structure illustrated by FIG. 6. It should be noted that the bus system preferably spans the entire component to the adjacent array of SRAMs 775, 780, 785, 790 through programmable elements (not shown). The bus system is further coupled to I/O ports or pads (e.g., 791, 792) for input/output to/from the system to external components or devices. Although the bus system can be coupled through hardwired connections, it is preferred that the connection be made via programmable elements, e.g., 765, 770 and bus system of lines 775.

Figure 8A:
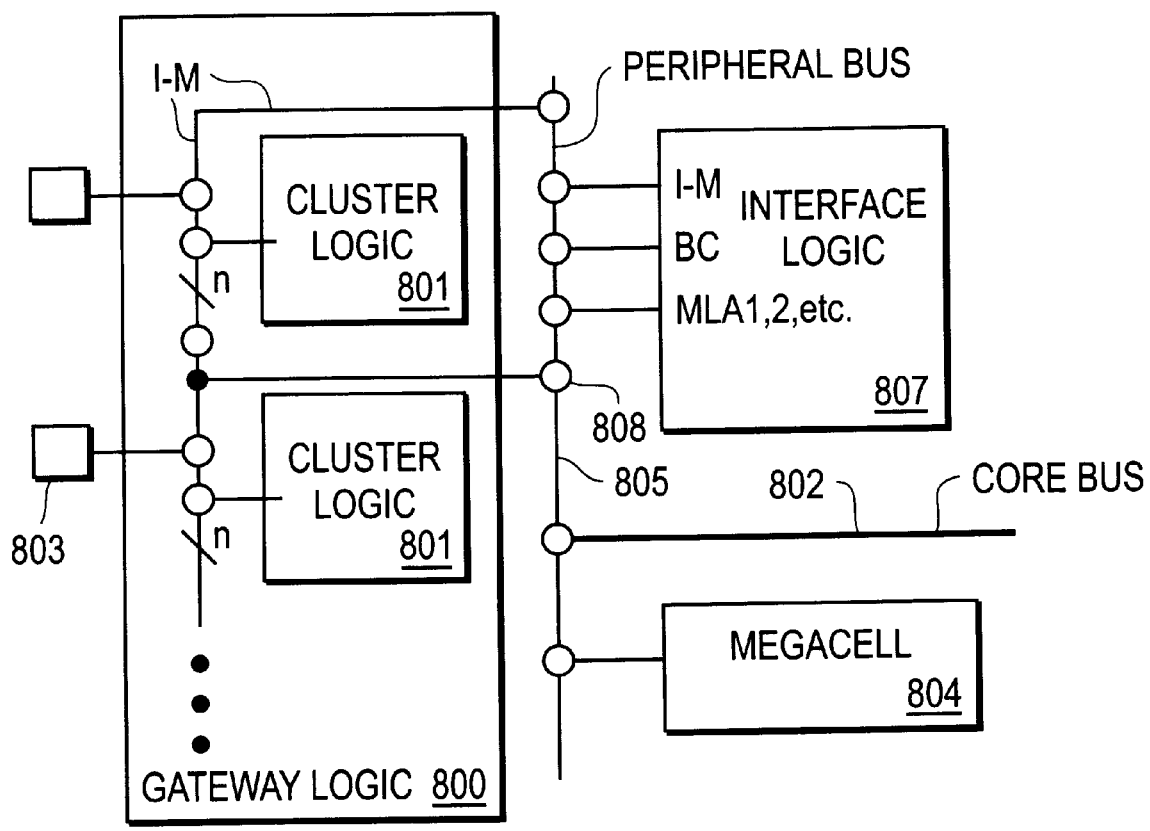
FIG. 8a is a block diagram illustration of an alternate embodiment and FIG. 8b illustrates the embodiment incorporated into a dual port SRAM with a FPGA.
Figure 8B:
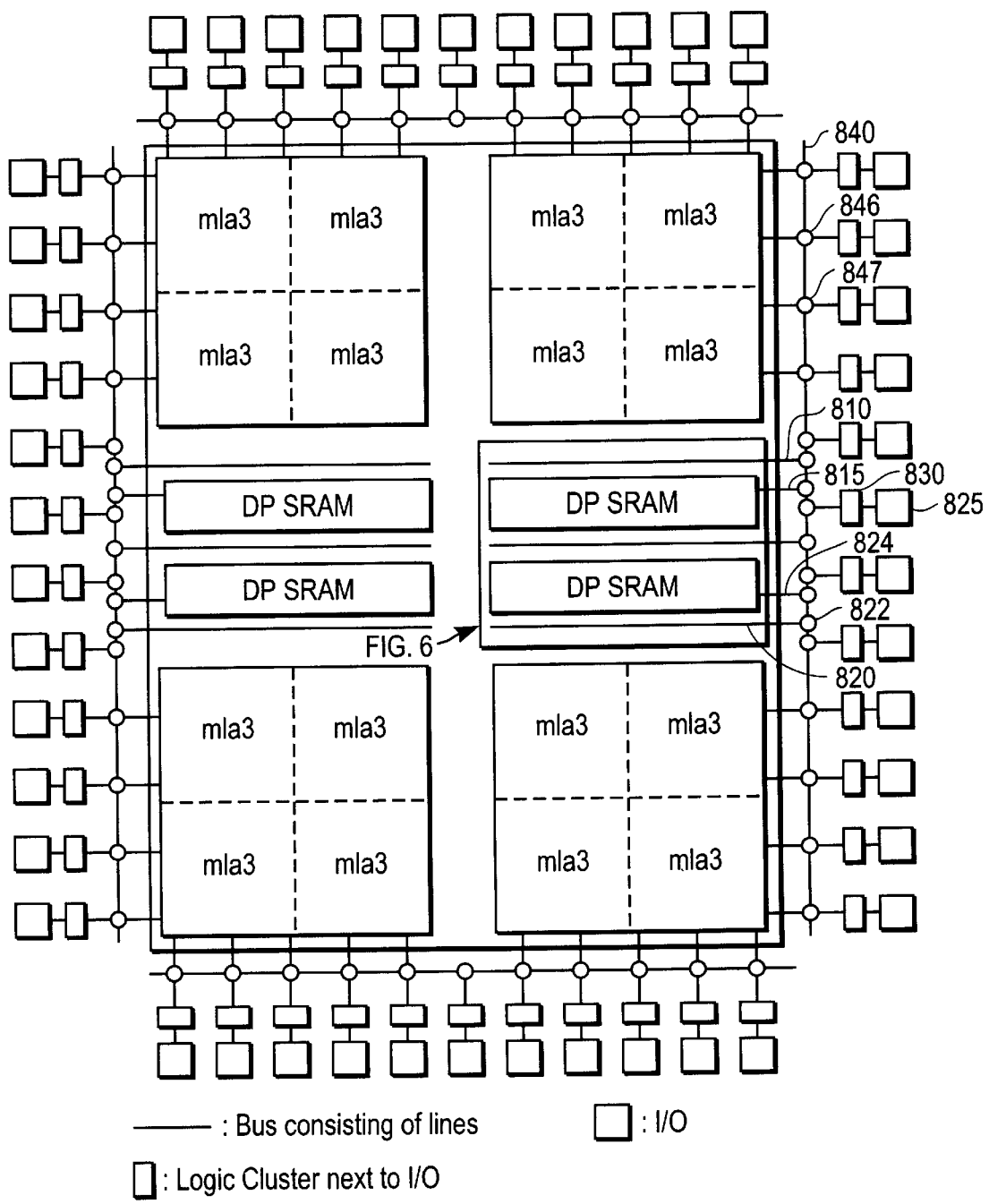

FIG. 8a is a block diagram illustration of an alternate embodiment in which gateway interface logic 801 is used to interface the core bus system 802 to the I/O 803. In addition, this diagram illustrates alternative programmable connections that can be implemented to provide further programmability and flexibility to the system.

The gateway interface logic 800 is composed of hardwired logic, metal programmable logic, or programmable logic such as a plurality of logic clusters and is directly or indirectly coupled (i.e., direct hardwired connections or indirect program controlled connections) to the megacell 804. FIG. 8a shows the gateway interface logic 800 is coupled to the megacell 804 via peripheral bus 805 which preferably includes bidirectional, three-statable connections (e.g., 808). The gateway interface logic 800 provides an additional level of logic to the interface between the megacell and the I/O pads or ports to external components or devices. The gateway interface logic can enable faster transfer of information. For example, the gateway interface logic can be structured to provide the specific bus protocols or handshaking required to interface to external devices. The gateway interface logic can also provide address decode functionality (e.g., wide decode) to expedite processing of information.

In the present embodiment, the gateway interface logic 800 is implemented as a logic cluster 801, consistent with the logic clusters referred to herein and in U.S. Pat. No. 5,457,410 and U.S. patent application Ser. No. 08/534,500. I-Matrix lines are used to connect the gateway logic to the peripheral bus 805. It should be recognized that the gateway interface logic is not limited to the specific implementation described herein and a variety of logic implementations can be used.

FIG. 5b illustrates dual port SRAMs with FPGA and the configurable bus system. In this embodiment, further programmability is provided at the I/O ports of the system using gateway interface logic. In particular, the programmable gateway logic (e.g., 830) is located between the core bus system of lines (e.g., elements 810, 815, 820) and the I/O (e.g., 825). In the present embodiment a logic cluster as illustrated in FIG. 4a is used; however, as noted above, it is contemplated that other forms of logic can be utilized. In addition, this embodiment includes a peripheral bus system of lines 840, which functions is a manner similar to the core bus system of lines, providing a programmable bus system for transferring information. Preferably, each of the programmable connections of the bus system (e.g., 846, 847) are bidirectional, three-statable connections.

Further enhancements and interconnect flexibility is achieved by providing programmable connections from the core bus (e.g., 820) direct to the peripheral bus 840 and from the megacell (e.g., 845) direct to the peripheral bus 840. For example, programmable connection 822 selectively enables the bug element 820 to be connected to peripheral bus 840. Similarly, programmable element 824 selectively connects megacell 845 directly to peripheral bus 840. Such flexibility is advantageous when speed is a consideration. For example, it may be desirable to directly connect externally received control input data to the megacell.

The invention has been described in conjunction with the preferred embodiment. It is evident that numerous alternatives, modifications, variations and uses will be apparent to those skilled in the art in light of the foregoing description.

What is claimed is:

1. An integrated circuit comprising:
   a plurality of conductors;
   a configurable cell;
   a plurality of interfaces, each interface of said plurality of interfaces having at least one logic controlled three-statable output port, a first interface of said plurality of interfaces coupled to said configurable cell; and
   the at least one three-statable output port of said first interface selectively couples to a first conductor of said plurality of conductors through a single switch and to a second conductor of said plurality of conductors through another single switch.

2. The integrated circuit as set forth in claim 1, further comprising at least one control port for each interface wherein at least one of a logic circuitry or a programmable control couples to the control port of said first interface.

3. The integrated circuit as set forth in claim 1, wherein said plurality of interfaces is selected from the group consisting of hardwired, metal programmable, and program-controlled logic gates and interconnections.

4. The integrated circuit as set forth in claim 2, wherein said logic circuitry is selected from the group consisting of hardwired, metal programmable, and program-controlled logic gates and interconnections.

5. The integrated circuit as set forth in claim 1, further comprising at least one programmable circuit comprising a plurality of configurable cells and programmable interconnect circuitry wherein said at least one programmable circuit selectively couples to the plurality of conductors through said plurality of interfaces.

6. The integrated circuit as set forth in claim 5, further comprising at least one megacell comprising logic gates and interconnections wherein said at least one megacell communicates to said at least one programmable circuit through said plurality of conductors controlled by said plurality of interfaces.

7. The integrated circuit as set forth in claim 6, wherein said at least one megacell is selected from the group consisting of hardwired, metal programmable, and program-controlled logic gates and interconnections.

8. The integrated circuit as set forth in claim 1, further comprising a third conductor of said plurality of conductors wherein said first conductor selectively couples said third conductor through a third single switch.

9. The integrated circuit as set forth in claim 8, wherein said switches comprise components selected from the group consisting of switches, programmable passgates and program controlled drivers/receivers.

10. A method of providing an integrated circuit, the method comprising:
    providing a plurality of conductors;
    providing a configurable cell;
    providing a plurality of interfaces, each interface of said plurality of interfaces having at least one logic controlled three-statable output port, a first interface of said plurality of interfaces coupled to said configurable cell; and
    selectively coupling the at least one three-statable output port of said first interface to a first conductor of said plurality of conductors through a single switch and to a second conductor of said plurality of conductors through another single switch.

11. The method of providing an integrated circuit as set forth in claim 10, wherein said switches comprise components selected from the group consisting of switches, programmable passgates and program controlled drivers/receivers.

12. The method of providing an integrated circuit as set forth in claim 10, further providing a control port to said first interface wherein at least one of a logic circuitry or programmable control couples to the control port of said first interface.

13. The method of providing an integrated circuit as set forth in claim 10, wherein said plurality of interfaces is selected from the group consisting of hardwired, metal programmable, and program-controlled logic gates and interconnections.

14. The method of providing an integrated circuit as set forth in claim 12, wherein said logic circuitry is selected from the group consisting of hardwired, metal programmable, and program-controlled logic gates and interconnections.

15. The method of providing an integrated circuit as set forth in claim 10, further comprising providing at least one programmable circuit comprising a plurality of configurable cells and programmable interconnect circuitry wherein said at least one programmable circuit selectively couples to the plurality of conductors through said plurality of interfaces.

16. The method of providing an integrated circuit as set forth in claim 15, further comprising at least one megacell comprising logic gates and interconnections wherein said at least one megacell communicates to said at least one programmable circuit through said plurality of conductors controlled by said plurality of interfaces.

17. The method of providing an integrated circuit as set forth in claim 16, wherein said at least one megacell is selected from the group consisting of hardwired, metal programmable, and program-controlled logic gates and interconnections.

18. The method of providing an integrated circuit as set forth in claim 10, further comprising providing a third conductor of said plurality of conductors wherein said first conductor selectively couples said third conductor through a third single switch.

19. The method of providing an integrated circuit as set forth in claim 18, wherein said switches comprise components selected from the group consisting of switches, programmable passgates and program controlled drivers/receivers.

20. An integrated circuit fabricated on a substrate, the integrated circuit comprising:
at least one programmable circuit comprising a plurality of configurable cells and programmable interconnect circuitry;
at least one bus system comprising a plurality of conductors and a plurality of bus interfaces, each bus interface of said plurality of bus interfaces having at least one input/output port; and
the programmable interconnect circuitry of said at least one programmable circuit making connections available to the at least one bus system through said plurality of bus interfaces wherein said at least one programmable circuit receives a first signal from a first conductor of said plurality of conductors through a first input/output port of a first bus interface of said plurality of bus interfaces and sends a second signal to said first conductor through said first input/output port.

21. The integrated circuit as set forth in claim 20, said first bus interface further comprising at least one control port wherein said first signal and said second signal on said first conductor are controlled through said at least one control port.

22. The integrated circuit as set forth in claim 20, wherein said at least one bus system is selected from the group consisting of hardwired, metal programmable, and program-controlled logic gates and interconnections.

23. The integrated circuit as set forth in claim 20, further comprising at least one megacell comprising logic gates and interconnections wherein said at least one programmable circuit receives said first signal from said at least one megacell through said first conductor controlled by said first bus interface and said at least one megacell receives said second signal from said at least one programmable circuit through said first conductor controlled by a second bus interface of said plurality of bus interfaces.

24. The integrated circuit as set forth in claim 23, wherein said at least one megacell is selected from the group consisting of hardwired, metal programmable, and program-controlled logic gates and interconnections.

25. The integrated circuit as set forth in claim 20, further comprising programmable interconnect circuitry for connecting at least one of directly connecting or indirectly connecting the at least one programmable circuit to an external device.

26. The integrated circuit as set forth in claim 20, wherein each of the configurable cells of said at least one programmable circuits comprises a function generator.

27. The integrated circuit as set forth in claim 20, wherein the at least one programmable circuit comprises a predetermined number of dedicated programmable regions, wherein each of the programmable regions is programmable for implementing a function.

28. The integrated circuit as set forth in claim 27, wherein the size of the programmable regions is selected form the group consisting of the same size and different size.

29. The integrated circuit as set forth in claim 20, further comprising a second conductor of said plurality of conductors wherein said first conductor selectively couples said second conductor through a single switch.

30. The integrated circuit as set forth in claim 29, wherein said switch comprises components selected from the group consisting of switches, programmable passgates and program controlled drivers/receivers.

31. A method of providing an integrated circuit on a substrate, the method comprising:
providing at least one programmable circuit comprising a plurality of configurable cells and programmable interconnect circuitry;
providing at least one bus system comprising a plurality of conductors and a plurality of bus interfaces, each bus interface of said plurality of bus interfaces comprising at least one input/output port; and
enabling the programmable interconnect circuitry of said at least one programmable circuit to make connection available to the at least one bus system through said plurality of bus interfaces wherein said at least one programmable circuit receives a first signal from a first conductor of said at least one bus system through a first input/output port of a first bus interface of said plurality of bus interfaces and sends a second signal to said first conductor through said first input/output port.

32. The method of providing an integrated circuit as set forth in claim 31, further comprising providing at least one control port to said first bus interface wherein said first signal and said second signal on said first conductor are controlled through said at least one control port.

33. The method of providing an integrated circuit as set forth in claim 31, wherein said at least one bus system is selected from the group consisting of hardwired, metal programmable, and program-controlled logic gates and interconnections.

34. The method of providing an integrated circuit as set forth in claim 31, further comprising:
providing at least one megacell comprising logic gates and interconnections wherein said at least one programmable circuit receives said first signal from said at least one megacell through said first conductor controlled by said first bus interface and said at least one megacell receives said second signal from said at least one programmable circuit through said first conductor controlled by a second bus interface of said plurality of bus interfaces.

35. The method of providing an integrated circuit as set forth in claim 34, wherein said at least one megacell is selected from the group consisting of hardwired, metal programmable, and program-controlled logic gates and interconnections.

36. The method of providing an integrated circuit as set forth in claim 31, further comprising providing the programmable interconnect circuitry for connecting at least one of directly connecting and indirectly connecting the at least one first programmable logic circuit to an external device.

37. The method of providing an integrated circuit as set forth in claim 31, further comprising providing a second conductor of said plurality of conductors wherein said first conductor selectively couples said second conductor through a single switch.

38. The method of providing an integrated circuit as set forth in claim 37, wherein said switch comprise components selected from the group consisting of switches, programmable passgates and program controlled drivers/receivers.

39. An integrated circuit comprising:
at least one programmable circuit comprising a plurality of configurable cells and programmable interconnect circuitry;
at least one megacell comprising logic gates and interconnections;
a plurality of conductors; and
said at least one programmable circuit communicates to the at least one megacell through said plurality of conductors wherein said at least one programmable circuits receives a first signal from said at least one megacell through a first conductor of said plurality of conductors and said at least one megacell receives a second signal from said at least one programmable circuits through said first conductor.

40. The integrated circuit as set forth in claim 39, further comprising a logic control circuitry coupling said first conductor wherein said at least one programmable circuits receives said first signal from said at least one megacell through said first conductor controlled by said logic control circuitry and said at least one megacell receives said second signal from said at least one programmable circuits through said first conductor controlled by said logic control circuitry.

41. The integrated circuit as set forth in claim 39, wherein said at least one megacell is selected from the group consisting of hardwired, metal programmable, and program-controlled logic gates and interconnections.

42. The integrated circuit chip as set forth in claim 39, wherein said plurality of conductors is selected from the group consisting of hardwired, metal programmable, and program-controlled interconnections.

43. The integrated circuit as set forth in claim 40, wherein said logic control circuitry is selected from the group consisting of hardwired, metal programmable, and program-controlled logic gates and interconnections.

44. The integrated circuit as set forth in claim 39, further comprising programmable interconnect circuitry for connecting the integrated circuit directly or indirectly to an external device.

45. A method of providing an integrated circuit, the method comprising:
providing at least one programmable circuit comprising a plurality of configurable cells and programmable interconnect circuitry;
providing at least one megacell comprising logic gates and interconnections;
providing a plurality of conductors; and
programming said at least one programmable circuits, wherein the at least one programmable circuit receives a first signal from said at least one megacell through a first conductor of said plurality of conductors and said at least one megacell receives a second signal from said at least one programmable circuit through said first conductor.

46. The method of providing an integrated circuit as set forth in claim 45, further comprising providing a logic control circuitry coupling said first conductor wherein said at least one programmable circuit receives said first signal from said at least one megacell through said first conductor controlled by said logic control circuitry and said at least one megacell receives a second signal from said at least one first programmable logic circuits through said first conductor controlled by said logic control circuitry.

47. The method of providing an integrated circuit as set forth in claim 45, wherein said at least one megacell is selected from the group consisting of hardwired, metal programmable, and program-controlled logic gates and interconnections.

48. The method of providing an integrated circuit as set forth in claim 45, wherein said plurality of conductors is selected from the group consisting of hardwired, metal programmable, and program-controlled interconnections.

49. The method of providing an integrated circuit as set forth in claim 46, wherein said logic control circuitry is selected from the group consisting of hardwired, metal programmable, and program-controlled logic gates and interconnections.

50. An integrated circuit comprising:
at least one programmable circuit comprising a plurality of configurable cells and programmable interconnect circuitry;
a first plurality of conductors; and
a logic controlled plurality of three-statable interface circuits, a first three-statable interface circuit of said plurality of three-statable interface circuits comprising a first three-statable port, said first three-statable port couples between the plurality of configurable cells and a first conductor of said first plurality of conductors, wherein the first three-statable port selectively couples through a first switch to said first conductor.

51. The integrated circuit as set forth in claim 50, further comprising a second three-statable interface circuit of said plurality of three-statable interface circuits, said second three-statable interface circuit comprising a second three-statable port, said second three-statable port couples between the plurality of configurable cells and said first conductor, wherein the second three-statable port selectively couples through a second switch to said first conductor.

52. The integrated circuit of claim 51, further comprising a control logic coupling said first three-statable interface circuit and said second three-statable interface circuit to dynamically control states of said first and said second three-statable interface circuits.

53. The integrated circuit chip as set forth in claim 50, wherein said plurality of three-statable interface circuits is selected from the group consisting of hardwired, metal programmable, and program-controlled logic gates and interconnections.

54. The integrated circuit chip as set forth in claim 52, wherein said control logic is selected from the group consisting of hardwired, metal programmable, and program-controlled logic gates and interconnections.

55. The integrated circuit as set forth in claim 50, further comprising a control port for said first three-stable interface circuit wherein at least one configurable cell of said plurality of configurable cells couples, through said programmable interconnect circuitry, to the control port of said first three-statable interface circuit.

56. The integrated circuit as set forth in claim 51, wherein the first switch and the second switch comprise components selected from the group consisting of switches, programmable passgates and program controlled drivers/receivers.

57. The integrated circuit as set forth in claim 50, wherein the configurable cells are coupled to said first plurality of conductors through said plurality of three-statable interface circuits.

58. The integrated circuit as set forth in claim 50, wherein the three-statable interface circuits are further coupled such that the output data from the configurable cells to the first plurality of conductors is processed through the three-statable interface circuits and input data to configurable cells from the first plurality of conductors is received from the three-statable interface circuits.

59. The integrated circuit as set forth in claim 52, wherein the control logic couples said plurality of configurable cells through said programmable interconnect circuitry.

60. The integrated circuit of claim 50, wherein a first configurable cell of the plurality of configurable cells is coupled, through said plurality of programmable interconnect circuitry, to a second configurable cell of the plurality of configurable cells.

61. The integrated circuit as set forth in claim 50, further comprising a second plurality of conductors, wherein the second plurality of conductors selectively extends the first plurality of conductors through programming means.

62. The integrated circuit as set forth in claim 50, further comprising a bi-directional port of a third three-statable interface circuit of said plurality of three-statable interface circuits, said bi-directional port couples through a third switch to a second conductor of said first plurality of conductors to receive data from said at least one programmable circuit and said bi-directional port couples through said third switch to said second conductor to send data to the at least one programmable circuit.

63. The integrated circuit as set forth in claim 52, wherein said third three-statable interface circuit comprises three-statable input-output logic selected from the group consisting of hardwired, metal programmable, and program-controlled logic gates and interconnections.

64. The integrated circuit as set forth in claim 50, said plurality of three-statable interface circuits further comprising a plurality of bi-directional ports coupled to the first plurality of conductors to enable transfer of data across the first plurality of conductors between a first circuit and a second circuit of the at least one programmable circuit.

65. The integrated circuit as set forth in claim 50, further comprising a third plurality of conductors coupling said at least one programmable circuit to a plurality of input/output pads of said integrated circuit.

66. The integrated circuit as set forth in claim 65, wherein said third plurality of conductors couples said at least one programmable circuit through said first plurality of conductors.

67. The integrated circuit as set forth in claim 65, wherein said coupling is selected from the group consisting of hardwired, metal programmable, and program-controlled logic gates and interconnections.

68. The integrated circuit as set forth in claim 65, further comprising additional logic coupling between the input/output pads and the third plurality of lines.

69. The integrated circuit as set forth in claim 68, wherein said additional logic and said coupling are selected from the group consisting of hardwired, metal programmable, and program-controlled logic gates and interconnections.

70. The integrated circuit as set forth in claim 50, further comprising at least one megatcell comprising logic gates and interconnections wherein said at least one programmable circuit receives a first signal from said at least one megacell through said first conductor controlled by a fourth three-statable interface circuit of said plurality of three-statable interface circuits and said at least one megacell receives a second signal from said at least one programmable circuit through said first conductor controlled by said first three-statable interface circuit.

71. The integrated circuit as set forth in claim 70, wherein said at least one megacell is selected from the group consisting of hardwired, metal programmable, and program-controlled logic gates and interconnections.

72. A method of providing an integrated circuit comprising:
    providing a first output signal from a first configurable cell;
    providing a first conductor; and
    using a logic controlled first three-statable circuit, selectively coupling the first output signal to said first conductor through a first switch.

73. The method of providing an integrated circuit as set forth in claim 72, further comprising:
    providing a second output signal from a second logic element;
    using a second three-statable circuit, selectively coupling the second output signal to said first conductor through a second switch; and
    multiplexing the conductor between the first output signal and the second output signal by controlling the first three-statable circuit and the second three-statable circuit.

74. The method of providing an integrated circuit as set forth in claim 72, further comprising the step of controlling the first three-statable circuit from a third logic element.

75. The method of providing an integrated circuit as set forth in claim 73, wherein the first switch and the second switch comprise components selected from the group consisting of switches, programmable passgates and program controlled drivers/receivers.

76. The method of providing an integrated circuit as set forth in claim 73, Wherein said second logic element is comprised of components selected from the group consisting of programmable circuits comprising program controlled configurable cells and a plurality of programmable interconnect circuitry, megacells comprising logic gates and interconnections wherein said logic gates and interconnections, and logic gates external to said integrated circuit coupled to the input/output pads of said integrated circuit.

77. The method of providing an integrated circuit as set forth in claim 76, wherein said logic gates and interconnections of said megacell are selected from the group consisting of hardwired, metal programmable, and program-controlled logic gates and interconnections.

78. The method of providing an integrated circuit as set forth in claim 72, further comprising providing a bidirectional port of a third three-statable interface circuit, said bi-directional port couples through switches to said first conductor to receive and send data.

79. The method of providing an integrated circuit as set forth in claim 78, wherein each of said first, second and third three-statable interface circuit comprises three-statatable input-output logic selected from the group consisting of hardwired, metal programmable, and program-controlled logic gates and interconnections.

80. An integrated circuit comprising:
    at least one programmable circuit comprising a plurality of configurable cells and programmable interconnect circuitry;
    at least one megacell comprising logic gates and interconnections;

a plurality of conductors; and a first conductor of said plurality of conductors having at least two independent driving sources, from at least one of said at least one programmable circuit or said at least one megacell, said driving sources driving said first conductor logically controlled by an interface circuit.

81. The integrated circuit as set forth in claim 80, wherein said at least one megacell is selected from the group consisting of hardwired, metal programmable, and program-controlled logic gates and interconnections.

82. The integrated circuit chip as set forth in claim 80, wherein said plurality of conductors is selected from the group consisting of hardwired, metal programmable, and program-controlled interconnections.

83. The integrated circuit as set forth in claim 80, wherein said interface circuit is selected from the group consisting of hardwired, metal programmable, and program-controlled logic gates and interconnections.

84. The integrated circuit as set forth in claim 80, wherein said interface circuit is further controlled through program selection.

85. The integrated circuit as set forth in claim 80, wherein said at least one programmable circuits receives a first signal from said at least one megacell through said first conductor controlled by said interface circuit and said at least one megacell receives a second signal from said at least one programmable circuit through said first conductor controlled by said interface circuit.

86. The integrated circuit as set forth in claim 80, wherein a first configurable cell of said at least one programmable circuit receives a third signal from a second configurable cell of said at least one programmable circuit through said first conductor controlled by said interface circuit and a third configurable cell of said at least one programmable circuit receives a fourth signal from a fourth configurable cell of said at least one programmable circuit through said first conductor controlled by said interface circuit.

87. The integrated circuit as set forth in claim 80, wherein a first logic gate of said at least one megacell receives a fifth signal from a second logic gate of said at least one megacell through said first conductor controlled by said interface circuit and a third logic gate of said at least one megacell receives a sixth signal from a fourth logic gate of said at least one megacell through said first conductor controlled by said interface circuit.

88. The integrated circuit as set forth in claim 80, further comprising programmable interconnect circuitry for connecting the integrated circuit directly or indirectly to an external device.

89. A method of providing an integrated circuit, the method comprising:

providing at least one programmable circuit comprising a plurality of configurable cells and programmable interconnect circuitry;

providing at least one megacell comprising logic gates and interconnections;

providing a plurality of conductors; and providing at least two independent driving sources from at least one of said at least one programmable circuit or said at least one megacell to drive a first conductor of said plurality of conductors logically controlled by an interface circuit.

90. The method of providing an integrated circuit as set forth in claim 89, wherein said at least one megacell is selected from the group consisting of hardwired, metal programmable, and program-controlled logic gates and interconnections.

91. The method of providing an integrated circuit as set forth in claim 89, wherein said plurality of conductors is selected from the group consisting of hardwired, metal programmable, and program-controlled interconnections.

92. The method of providing an integrated circuit as set forth in claim 89, wherein said interface circuit is selected from the group consisting of hardwired, metal programmable, and program-controlled logic gates and interconnections.

93. The method of providing an integrated circuit as set forth in claim 89, wherein said interface circuit is further controlled through program selection.

94. The method of providing an integrated circuit as set forth in claim 89, wherein said at least one programmable circuit or said at least one megacell receives a first signal from said at least one programmable circuit or said at least one megacell through said first conductor controlled by said interface circuit and said at least one programmable circuit or said at least one megacell receives a second signal from said at least one programmable circuit or said at least one megacell through said first conductor controlled by said interface circuit.

95. An integrated circuit comprising:

a first logic group comprising logic gates and interconnections;

a configurable cell;

a first plurality of conductors; and a first three-statable driving source, controlled logically through a first interface circuit of a plurality of interface circuits, of said first logic group selectively coupled to drive a first conductor and a second conductor of said first plurality of conductors, wherein said first interface is coupled to said configurable cell.

96. The integrated circuit chip as set forth in claim 95, wherein said first logic group is selected from the group consisting of hardwired, metal programmable, and program-controlled logic gates and interconnections.

97. The integrated circuit chip as set forth in claim 95, wherein said plurality of interface circuits is selected from the group consisting of hardwired, metal programmable, and program-controlled logic gates and interconnections.

98. The integrated circuit chip as set forth in claim 95 wherein said first plurality of conductors is selected from the group consisting of hardwired, metal programmable, and program-controlled interconnections.

99. The integrated circuit as set forth in claim 95, wherein the plurality of interface circuits are further coupled such that the output data from said first logic group to the first plurality of conductors is processed through the plurality of interface circuits and input data to said first logic group from the first plurality of conductors is received from the plurality of interface circuits.

100. The integrated circuit as set forth in claim 99, wherein said interconnections comprise a programmable interconnect circuitry and the plurality of interface circuits couples the logic gates of said first logic group through said programmable interconnect circuitry.

101. The integrated circuit as set forth in claim 95, wherein said logic gates comprise a plurality of configurable cells and said interconnections comprise a programmable interconnect circuitry wherein a first configurable cell of said plurality of configurable cells is coupled, through said programmable interconnect circuitry, to a second configurable cell of the plurality of configurable cells.

102. The integrated circuit as set forth in claim 95, further comprising a second plurality of conductors, wherein the second plurality of conductors selectively extends the first plurality of conductors through programming means.

103. The integrated circuit as set forth in claim 95, further comprising a bi-directional port of a second interface circuit of said plurality of interface circuits, said bi-directional port coupling through a first switch to a second conductor of said first plurality of conductors to receive data from said first logic group and coupling through said first switch to said second conductor to send data to the first logic group.

104. The integrated circuit as set forth in claim 103, wherein said second interface circuit comprises input-output logic selected from the group consisting of hardwired, metal programmable, and program-controlled logic gates and interconnections.

105. The integrated circuit as set forth in claim 95, said plurality of interface circuits further comprising a plurality of bi-directional ports coupled to the first plurality of conductors to enable transfer of data across the first plurality of conductors between a first circuit and a second circuit of the first logic group.

106. The integrated circuit as set forth in claim 95, further comprising a third plurality of conductors coupling said first logic group to a plurality of input/output pads of said integrated circuit.

107. The integrated circuit as set forth in claim 106, wherein said third plurality of conductors couples said first logic group through said first plurality of conductors.

108. The integrated circuit as set forth in claim 107, wherein said coupling is selected from the group consisting of hardwired, metal programmable, and program-controlled logic gates and interconnections.

109. The integrated circuit as set forth in claim 106, further comprising additional logic coupling the input/output pads and the third plurality of lines.

110. The integrated circuit as set forth in claim 109, wherein said additional logic and said coupling are selected from the group consisting of hardwired, metal programmable, and program-controlled logic gates and interconnections.

111. The integrated circuit as set forth in claim 95, further comprising at least one programmable circuit comprising configurable cells and a programmable interconnect circuitry wherein said at least one programmable circuit receives a first signal from said first logic group through said first conductor controlled by said first interface circuit and said first logic group receives a second signal from said at least one programmable circuit through said first conductor controlled by a third interface circuit of said plurality of interface circuits.

112. A method of providing an integrated circuit comprising:
providing a first three-statable output signal from a first logic element; and
selectively coupling using programmable means the first three-statable output signal, controlled logically using a first interface circuit coupled to a configurable cell, to a first conductor and a second conductor.

113. The method of providing an integrated circuit as set forth in claim 112, wherein said first logic element comprises components selected from the group consisting of programmable circuits comprising program controlled configurable cells and a plurality of programmable interconnect circuitry, megacells comprising logic gates and interconnections and logic gates external to said integrated circuit coupled to the input/output pads of said integrated circuit.

114. The method of providing an integrated circuit as set forth in claim 113, wherein said logic gates and interconnections of said megacell are selected from the group consisting of hardwired, metal programmable, and program-controlled logic gates and interconnections.

115. The method of providing an integrated circuit as set forth in claim 112, further comprising providing a bi-directional port of a second interface circuit, said bi-directional port coupling through switches to said first conductor to receive and send data.

116. The method of providing an integrated circuit as set forth in claim 115, wherein said second interface circuit comprises input/output logic selected from the group consisting of hardwired, metal programmable, and program-controlled logic gates and interconnections.

117. An integrated circuit comprising:
at least one programmable circuit region comprising configurable cells and programmable interconnect circuitry, said programmable circuit region being selectively programmable after manufacture in accordance with user desired logic functions and connection relationships;
at least one megacell region comprising logic elements having customized or customizable functions and connections relationships; and
at least one circuit interface region which provides communication between the at least one programmable circuit region and the at least one megacell region.

118. The integrated circuit as set forth in claim 117, wherein said megacell region is selected from the group consisting of hardwired and metal programmable logic gates and interconnections.

119. The integrated circuit as set forth in claim 117, wherein said at least one circuit interface region is selected from the group consisting of hardwired, metal programmable, and program-controlled logic gates and interconnections.

120. The integrated circuit as set forth in claim 117, further comprising an input/output (I/O) system comprising I/O pads and associated I/O circuits wherein said I/O system provides communication between said integrated circuit and signals external to said integrated circuit.

121. The integrated circuit as set forth in claim 120, further comprising an interconnect architecture for making connections between said at least one programmable circuit region, said at least one megacell region and said I/O system.

122. The integrated circuit as set forth in claim 119, wherein said interconnect architecture is selected from the group consisting of hardwired, metal programmable, and program-controlled interconnections.

123. The integrated circuit as set forth in claim, 117, further comprising at least one input/output region for providing input/output to the integrated circuit.

124. The integrated circuit as set forth in claim 123, wherein the at least one megacell region comprises at least one control circuit that produces a configuration data signal from a data signal received as an input and wherein the at least one programmable circuit region comprises at least one configuration control circuit that utilizes the configuration data signal to configure the at least one programmable circuit region to perform a user programmed function.

125. The integrated circuit as set forth in claim 124, wherein said configuration data signal are dynamically generated to selectively program portions of said at least one programmable circuit region.

126. The integrated circuit as set forth in claim 117, wherein the at least one megacell region comprises at least one gateway interface circuit having a protocol or handshake for providing a link between an external device and the at least one programmable circuit region.

127. The integrated circuit as set forth in claim 126, wherein said at least one gateway interface circuit is selected from the group consisting of hardwired, metal programmable, and program-controlled logic gates and interconnections.

128. The integrated circuit as set forth in claim 117, wherein the at least one megacell region comprises at least one microprocessor controller.

129. The integrated circuit as set forth in claim 117, further comprising:
   at least one function selectively programmed into the at least one programmable circuit region; and
   at least one connection selectively programmed into the circuit interface region wherein the at least one connection provides communication between the at least one programmable circuit region and the at least one megacell region.

130. A method of providing an integrated circuit, the method comprising:
   providing at least one programmable circuit region comprising configurable cells and programmable interconnect circuitry, said programmable circuit being selectively programmable after manufacture in accordance with user desired logic functions and connection relationships;
   providing at least one megacell region comprising logic elements having customized or customizable functions and connections relationships; and
   providing at least one circuit interface region which provides communication between the at least one programmable circuit region and the at least one megacell region.

131. The method as set forth in claim 130, wherein said megacell region is selected from the group consisting of hardwired and metal programmable logic gates and interconnections.

132. The method as set forth in claim 130, wherein said at least one circuit interface region is selected from the group consisting of hardwired, metal programmable, and program-controlled logic gates and interconnections.

133. The method as set forth in claim 130, further comprising providing an I/O system comprising I/O pads and associated I/O circuits wherein said I/O system provides communication between said integrated circuit and signals external to said integrated circuit.

134. The method as set forth in claim 133, further comprising providing an interconnect architecture for making connections between said at least one programmable circuit region, said at least one megacell region and said I/O system.

135. The method as set forth in claim 134, wherein said interconnect architecture is selected from the group consisting of hardwired, metal programmable, and program-controlled interconnections.

136. The method as set forth in claim 130, further comprising providing at least one input/output region for providing input/output to the integrated circuit.

137. The method as set forth in claim 136, wherein the at least one megacell region produces a configuration data signal from data signal received as an input and the at least one programmable circuit region utilizes the configuration data signal to configure the at least one programmable circuit region to perform a user programmed function.

138. The method as set forth in claim 137, wherein said configuration data signal are dynamically generated to selectively program portions of said at least one programmable circuit region.

139. The method as set forth in claim 130, further comprising providing at least one gateway interface circuit of said at least one megacell region having a protocol or handshake for providing a link between an external device and the at least one programmable circuit region.

140. The method as set forth in claim 139, wherein said at least one gateway interface circuit is selected from the group consisting of hardwired, metal programmable, and program-controlled logic gates and interconnections.

141. The method as set forth in claim 130, wherein the at least one megacell region comprises at least one microprocessor controller.

142. The method as set forth in claim 130, further comprising:
   selectively programming at least one function into the at least one programmable circuit region; and
   selectively programming at least one connection into the circuit interface region wherein the at least one connection provides communication between the at least one programmable circuit region and the at least one megacell region.

* * * * *